United States Patent
Kasai et al.

(10) Patent No.: US 9,774,171 B2
(45) Date of Patent: Sep. 26, 2017

(54) MULTIPLEXER, MULTIPLEXING METHOD, AND LD MODULE USING OUTSIDE-REFLECTING DOUBLE MIRRORS

(71) Applicant: FUJIKURA LTD., Tokyo (JP)

(72) Inventors: Yohei Kasai, Sakura (JP); Susumu Nakaya, Sakura (JP); Shinichi Sakamoto, Sakura (JP)

(73) Assignee: FUJIKURA LTD., Tokyo (JP)

( * ) Notice: Subject to any disclaimer, the term of this patent is extended or adjusted under 35 U.S.C. 154(b) by 0 days.

(21) Appl. No.: 14/435,226

(22) PCT Filed: Sep. 25, 2013

(86) PCT No.: PCT/JP2013/075814
§ 371 (c)(1),
(2) Date: Apr. 13, 2015

(87) PCT Pub. No.: WO2014/103451
PCT Pub. Date: Jul. 3, 2014

(65) Prior Publication Data
US 2015/0280404 A1 Oct. 1, 2015

(30) Foreign Application Priority Data
Dec. 27, 2012 (JP) ................. 2012-286085

(51) Int. Cl.
*H01S 5/40* (2006.01)
*G02B 27/10* (2006.01)
(Continued)

(52) U.S. Cl.
CPC .............. *H01S 5/4012* (2013.01); *G02B 5/10* (2013.01); *G02B 6/425* (2013.01); *G02B 6/4214* (2013.01);
(Continued)

(58) Field of Classification Search
None
See application file for complete search history.

(56) References Cited

U.S. PATENT DOCUMENTS

| 4,826,269 A | 5/1989 | Streifer et al. |
| 5,513,201 A | 4/1996 | Yamaguchi et al. |

(Continued)

FOREIGN PATENT DOCUMENTS

| CN | 1164657 A | 11/1997 |
| CN | 1519613 A | 8/2004 |

(Continued)

OTHER PUBLICATIONS

Office Action for Japanese Application No. 2012-286085, dated Jun. 24, 2014.

(Continued)

*Primary Examiner* — Andrew Jordan
(74) *Attorney, Agent, or Firm* — Westerman, Hattori, Daniels & Adrian, LLP

(57) ABSTRACT

A multiplexer includes: an output section outputting a beam bundle made of a plurality of laser beams whose F-axis directions are aligned; and an F-axis converging lens causing the beam bundle outputted from the output section to be converged in the F-axis direction. Optical axes of the plurality of laser beams constituting the beam bundle outputted from the output section intersect with each other at a single point without relying on the F-axis converging lens.

9 Claims, 12 Drawing Sheets

(51) Int. Cl.
*G02B 6/42* (2006.01)
*G02B 5/10* (2006.01)
*G02B 27/12* (2006.01)
*H01S 5/00* (2006.01)
*H01S 5/022* (2006.01)

(52) U.S. Cl.
CPC .......... *G02B 6/4296* (2013.01); *G02B 27/10* (2013.01); *G02B 27/106* (2013.01); *G02B 27/12* (2013.01); *H01S 5/0071* (2013.01); *H01S 5/4075* (2013.01); *H01S 5/005* (2013.01); *H01S 5/02252* (2013.01); *H01S 5/02284* (2013.01); *H01S 5/4031* (2013.01)

(56) References Cited

U.S. PATENT DOCUMENTS

| | | | | |
|---|---|---|---|---|
| 5,629,791 | A * | 5/1997 | Harrigan | G02B 27/09 359/223.1 |
| 5,808,323 | A | 9/1998 | Spaeth et al. | |
| 5,877,898 | A | 3/1999 | Hollemann et al. | |
| 6,124,973 | A | 9/2000 | Du et al. | |
| 6,922,288 | B2 * | 7/2005 | Yamanaka | 359/618 |
| 7,286,308 | B2 * | 10/2007 | Kennedy | 359/836 |
| 7,339,975 | B2 * | 3/2008 | Yamanaka | G02B 27/0961 372/101 |
| 2002/0051360 | A1 | 5/2002 | Solodovnikov et al. | |
| 2002/0090172 | A1 | 7/2002 | Okazaki et al. | |
| 2004/0095969 | A1 | 5/2004 | Kaji et al. | |
| 2004/0233964 | A1 | 11/2004 | Yamanaka et al. | |
| 2004/0252388 | A1 | 12/2004 | Yamanaka et al. | |
| 2004/0264862 | A1 | 12/2004 | Nagano | |
| 2006/0274434 | A1 | 12/2006 | Mino et al. | |
| 2007/0237455 | A1 * | 10/2007 | Sonoda | 385/33 |
| 2008/0101429 | A1 | 5/2008 | Sipes | |
| 2009/0129420 | A1 | 5/2009 | Regaard et al. | |
| 2009/0245315 | A1 | 10/2009 | Faybishenko | |
| 2011/0103409 | A1 | 5/2011 | Sipes, Jr. | |
| 2012/0018412 | A1 | 1/2012 | Ito | |
| 2013/0170791 | A1 | 7/2013 | Kasahara et al. | |
| 2013/0194801 | A1 | 8/2013 | Wolf et al. | |
| 2015/0280404 | A1 * | 10/2015 | Kasai | G02B 27/10 385/33 |
| 2016/0252679 | A1 * | 9/2016 | Sakamoto | |

FOREIGN PATENT DOCUMENTS

| | | | |
|---|---|---|---|
| CN | 1521963 | A | 8/2004 |
| CN | 1553240 | A | 12/2004 |
| CN | 102401949 | A | 4/2012 |
| CN | 202383321 | U | 8/2012 |
| DE | 198 41 040 | A1 | 3/1999 |
| DE | 10 2007 002 498 | A1 | 1/2008 |
| EP | 0 660 157 | A1 | 6/1995 |
| EP | 2 061 122 | A1 | 5/2009 |
| JP | 61-212819 | A | 9/1986 |
| JP | 63-113509 | A | 5/1988 |
| JP | 5-15009 | U | 2/1993 |
| JP | 7-98402 | A | 4/1995 |
| JP | 7-199117 | A | 8/1995 |
| JP | 8-271832 | | 10/1996 |
| JP | 10-510933 | A | 10/1998 |
| JP | 2001-215443 | A | 8/2001 |
| JP | 2002-202442 | A | 7/2002 |
| JP | 2003-309309 | | 10/2003 |
| JP | 2004-145136 | A | 5/2004 |
| JP | 2004-252428 | A | 9/2004 |
| JP | 2004-258624 | A | 9/2004 |
| JP | 2005-309370 | | 11/2005 |
| JP | 2007-19301 | | 1/2007 |
| JP | 2009-520353 | A | 5/2009 |
| JP | 2009-170881 | A | 7/2009 |
| JP | 2010-91658 | A | 4/2010 |
| JP | 2011-107723 | A | 6/2011 |
| JP | 2012-24784 | A | 2/2012 |
| JP | 2012-58409 | A | 3/2012 |
| WO | 02/50599 | A1 | 6/2002 |
| WO | 2007/078456 | A1 | 7/2007 |
| WO | 2012/004381 | A2 | 1/2012 |

OTHER PUBLICATIONS

Office Action for Japanese Application No. 2012-286085, dated Oct. 28, 2014.
Notice of Allowance for Japanese Application No. 2012-286085, dated Feb. 24, 2015.
International Search Report dated Nov. 5, 2013, issued in corresponding application No. PCT/JP2013/075814.
Office Action dated Sep. 28, 2015, issued in counterpart Chinese Patent Application No. 201380053399.3 (6 pages).
Japanese Office Action dated Dec. 15, 2015 (mailing date), issued in counterpart Japanese Patent Application No. 2015-054018 with English translation.
European Search Report dated Jan. 7, 2016, issued in counterpart European Patent Application No. 13869600.0. (7 pages).
Office Action dated Aug. 2, 2016, issued in Japanese Patent Application No. 2015-054018, with English translation. (7 pages).
Office Action dated Jun. 9, 2015 Application No. 2014-524182 (1 page).
Extended European Search Report dated Aug. 12, 2015, issued in European Application No. 13832216.9 (5 pages).
Office Action dated Sep. 24, 2015, issued in Chinese Application No. 201380044951.2. (11 pages).
Office Action dated Feb. 9, 2016, issued in Japanese Application No. 2015-090869 (3 pages).
Office Action dated Aug. 26, 2014, issued in Japanese Application No. 2014-524182, with English translation (6 pages).
Office Action dated Nov. 11, 2014, issued in Japanese Application No. 2014-524182 with English translation (7 pages).
Office Action dated Jan. 27, 2015, issued in Japanese Application No. 2014-524182 with English translation (8 pages).
Search Report dated Sep. 17, 2013, issued in counterpart International Application No. PCT/JP2013/071847 (1 page).
Non-Final Office Action dated Jun. 2, 2016, issued in U.S. Appl. No. 14/424,335 (11 pages).
Final Office Action dated Oct. 3, 2016, issued in U.S. Appl. No. 14/424,335 (12 pages).
Notice of Allowance dated Dec. 14, 2016, issued in U.S. Appl. No. 14/424,335 (7 pages).
Office Action dated Jun. 8, 2016, issued in Chinese Patent Application No. 201380044951.2. (12 pages).
Notice of Allowance dated Apr. 26, 2016, issued in Japanese Patent Application No. 2015-090869, with English translation. (4 pages).
Japanese Notice of Allowance dated Feb. 7, 2017, issued in Japanese Patent Application No. 2015-054018 with an English translation.
U.S. Notice of Allowance dated Mar. 9, 2017, issued in U.S. Appl. No. 14/424,335.

* cited by examiner

MULTIPLEXER, MULTIPLEXING METHOD, AND LD MODULE USING OUTSIDE-REFLECTING DOUBLE MIRRORS

TECHNICAL FIELD

The present invention relates to a multiplexer and a multiplexing method for multiplexing a plurality of laser beams. The present invention also relates to an LD module including such a multiplexer.

BACKGROUND ART

LD modules are widely used for the purpose of coupling a laser beam emitted from an LD (Laser Diode) element (semiconductor laser element) to an optical fiber. Among such LD modules, a micro-optical device disclosed in Patent Literature 1 has been known as a light-guiding device that guides a laser beam emitted from each of a plurality of LED elements to an optical fiber.

FIG. 12 is a perspective view of a micro-optical device 10 disclosed in Patent Literature 1. As illustrated in FIG. 12, the micro-optical device 10 includes a base plate 11, an LD bar 12, a cylindrical lens 13, a first mirror row 14, and a second mirror row 15.

The LD bar 12 includes a plurality of LD elements aligned along an x axis and emits laser beams in a z-axis positive direction from the plurality of LD elements, respectively. The laser beams emitted in the z-axis positive direction from the plurality of LD elements, respectively, have respective optical axes that are aligned along the x axis within a first plane parallel to a zx plane.

Note that propagation directions of the laser beams emitted from the LD elements, respectively, are dispersed in directions in a range of ±θx around the z-axis positive direction at the center. On this account, the micro-optical device 10 is arranged such that the laser beams emitted from the LD elements, respectively, are collimated by the cylindrical lens 13 that is provided so as to face an emission edge surface of the LD bar 12 (i.e., the propagation directions are converged in the z-axis positive direction).

The first mirror row 14 is a mirror row in which mirror surfaces 14a are combined. The mirror surfaces 14a are opposed to the LD elements, respectively, which constitute the LD bar 12. Each of the laser beams emitted from the LD elements in the z-axis positive direction, respectively, is reflected into a y-axis positive direction by a corresponding mirror surface 14a which is opposed to a corresponding one of the LD element. Meanwhile, the second mirror row 15 is a mirror row in which mirror surfaces 15a are combined. The mirror surfaces 15a are opposed to the mirror surfaces 14a, respectively, which constitute the first mirror row 14. Each of the laser beams having been reflected into the y-axis positive direction by the mirror surfaces 14a, respectively, is further reflected into an x-axis positive direction by a corresponding mirror surface 15a which is opposed to one of the mirror surface 14a that has reflected the laser beam.

Note that, mirror surfaces 14a and 15a that reflect a laser beam emitted from an (i+1)th LD element (as counted in a direction from an x-axis positive side to an x-axis negative side) are provided on a z-axis negative direction side of mirror surfaces 14a and 15b that reflect a laser beam emitted from an i-th LD element (as counted in the direction from the x-axis positive side to the x-axis negative side). On this account, optical axes of the laser beams reflected by the mirror surfaces 15a are aligned along a z axis in a second plane that is parallel to the zx plane. This second plain is at a position on a y-axis positive direction side of the first plane as described above.

In this way, the micro-optical device 10 functions to convert a first beam bundle made of laser beams propagating in the z-axis positive direction in which the laser beams are emitted from the LD elements constituting the LD bar 12, to a second beam bundle made of laser beams propagating in an x-axis direction into which the laser beams are reflected by the mirror surfaces 15a constituting the second mirror row 15. The second beam bundle that is to be outputted from the micro-optical device 10 (hereinafter, referred to as "output beam bundle") is converged on an incident edge surface of an optical fiber by, for example, a lens (not illustrated).

In an LD module including the micro-optical device 10, the second beam bundle (hereinafter, referred to as "output beam bundle") outputted from the micro-optical device 10 is converged by an F-axis converging lens. Then, the output beam bundle converged by the F-axis converging lens enters an optical fiber through an intersection of the laser beams constituting the output beam bundle, that is, through an incident edge surface provided on a focal point of the F-axis converging lens. Note that the laser beams constituting the output beam bundle, that is, optical axes of the laser beams reflected by the mirror surfaces 15a constituting the second mirror row 15 are parallel to one another.

CITATION LIST

Patent Literature

Patent Literature 1
Japanese Patent Application Publication, Tokukai, No. 2004-252428 (Publication Date: Sep. 9, 2004)

SUMMARY OF INVENTION

Technical Problem

In order to reduce a size of an LD module, a focal length of an F-axis converging lens should be reduced by reducing a radius of curvature of the F-axis converging lens, since this allows an incident edge surface of an optical fiber to be closer to the F-axis converging lens. However, a reduction in radius of curvature of the F-axis converging lens leads to a problem that an incidence angle at which a laser beam having passed through the F-axis converging lens enters the optical fiber is increased, so that a coupling efficiency decreases. This is because a laser beam whose incidence angle is greater than an acceptance angle of the optical fiber among the laser beams that have passed through the F-axis converging lens is lost instead of being confined inside a core of the optical fiber.

The present invention is attained in view of the above problems. An object of the present invention is to reduce a size of an LD module without sacrificing coupling efficiency. It is also an object of the present invention to provide a multiplexer that is necessary for reducing the size of the LD module.

Solution to Problem

In order to attain the object, a multiplexer of the present invention includes: an output section outputting a beam bundle made of a plurality of laser beams whose optical axes are contained in a single plane, each of the plurality of laser beams having an F-axis that is not orthogonal to the single plane; and a converging lens converging the beam bundle outputted from the output section, extensions of the optical axes of the plurality of laser beams at a portion where the beam bundle has been outputted from the output section but has not been converged by the converging lens intersecting with each other at a single point, an intersection of the plurality of laser beams at a portion where the beam bundle has been converged by the converging lens being formed at a position that is closer to the converging lens than a focal point of the converging lens is.

In order to attain the object, a multiplexing method of the present invention includes the steps of: (a) outputting a beam bundle made of a plurality of laser beams whose optical axes are contained in a single plane, each of the plurality of laser beams having an F-axis that is not orthogonal to the single plane; and (b) converging, by use of a converging lens, the beam bundle outputted in the step (a), extensions of the optical axes of the plurality of laser beams at a portion where the beam bundle has been outputted in the step (a) but has not been converged in the step (b) intersecting with each other at a single point, an intersection of the plurality of laser beams at a portion where the beam bundle has been converged in the step (b) being formed at a position that is closer to the converging lens than a focal point of the converging lens is.

Advantageous Effects of Invention

The present invention makes it possible to reduce a size of an LD module by providing the multiplexer in the LD module.

Figure 10:
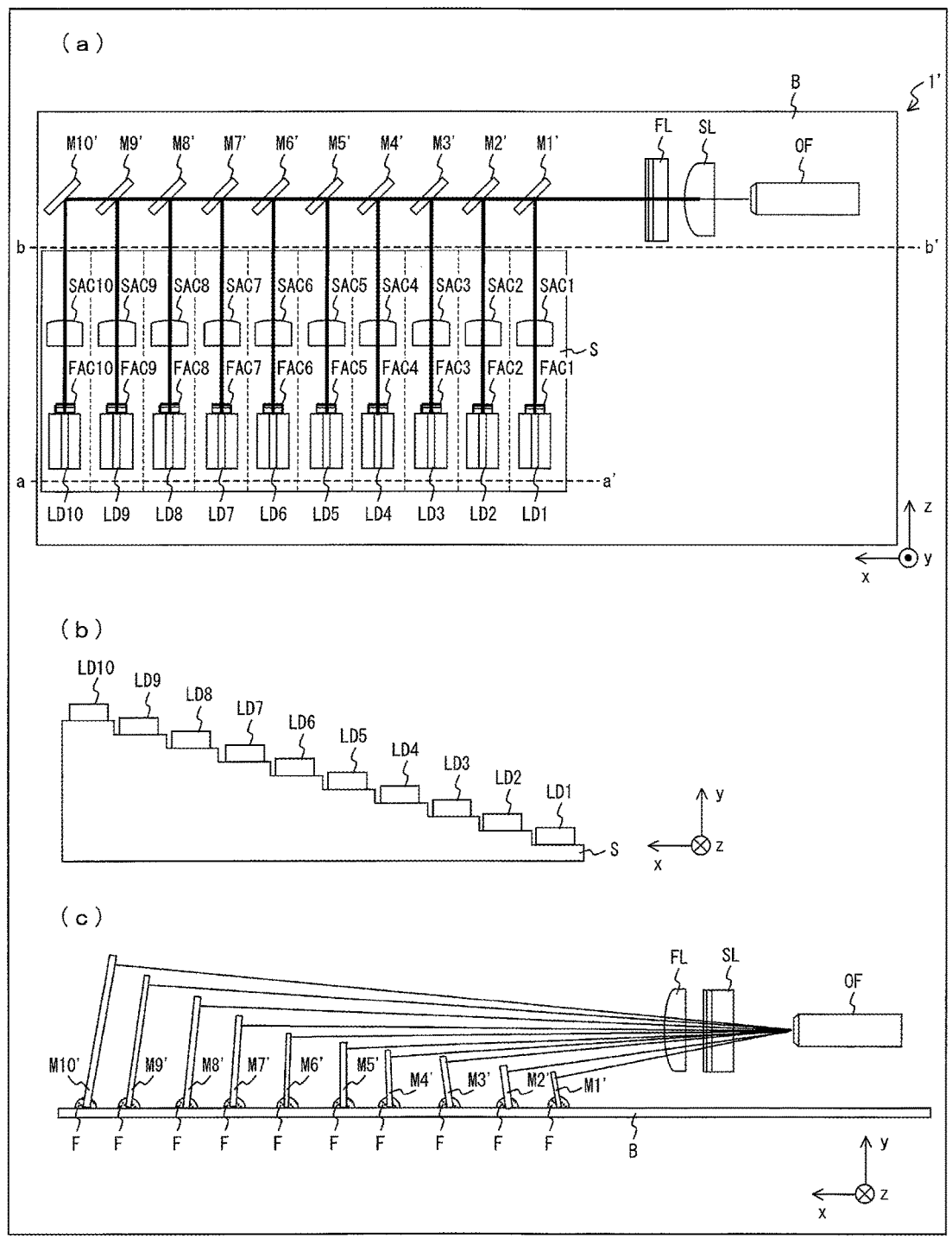

(a) of FIG. 10 is a plan view illustrating a configuration of an LD module according to Second Embodiment of the present invention. (b) is a cross-sectional view illustrating an a-a' cross-sectional surface taken along a line a-a' in (a) of FIG. 10. (c) is a cross-sectional view illustrating a b-b' cross-sectional surface taken along a line b-b' in (a) of FIG. 10.

Figure 11:
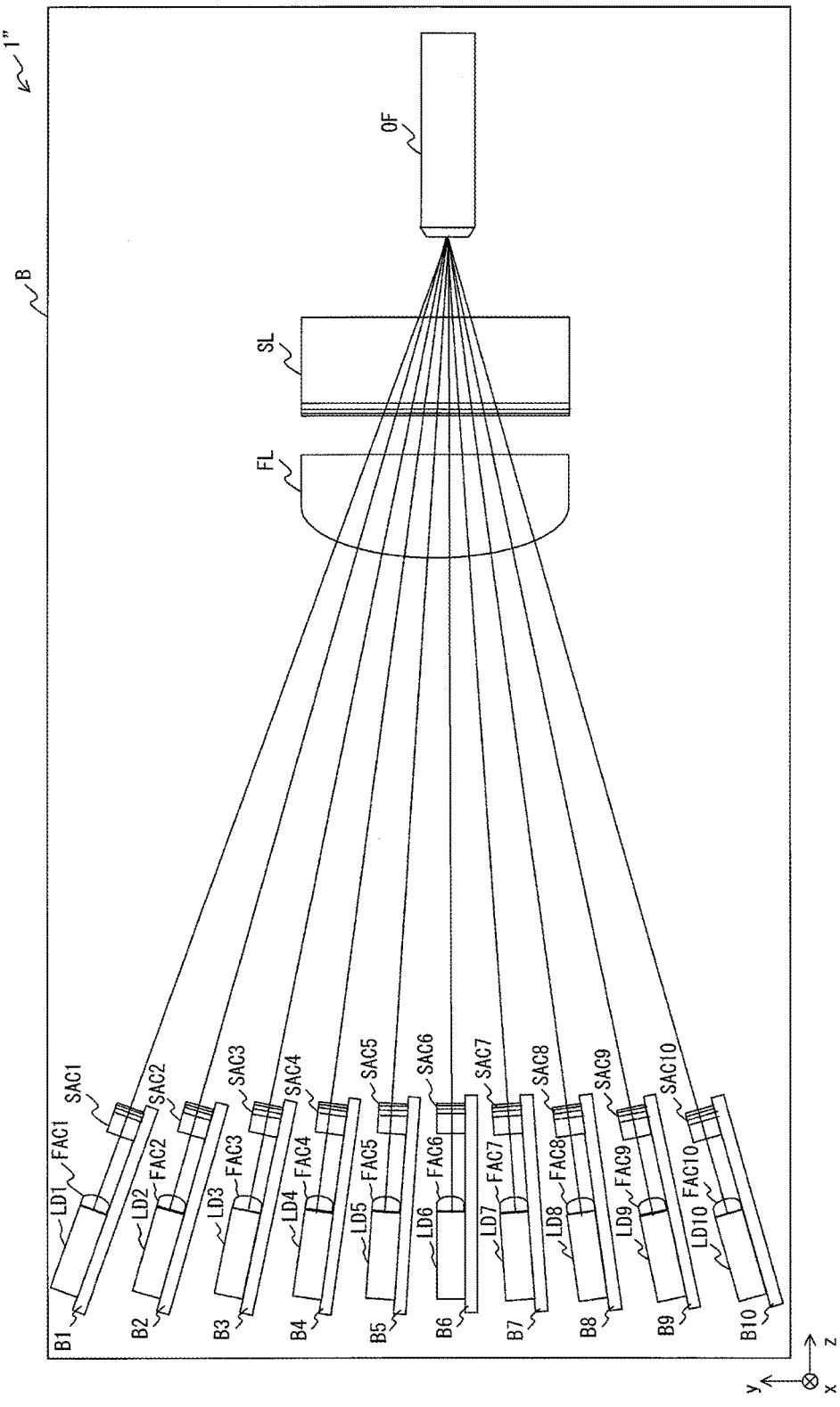

FIG. 11 is a plan view illustrating a configuration of an LD module according to Third Embodiment of the present invention.

Figure 12:
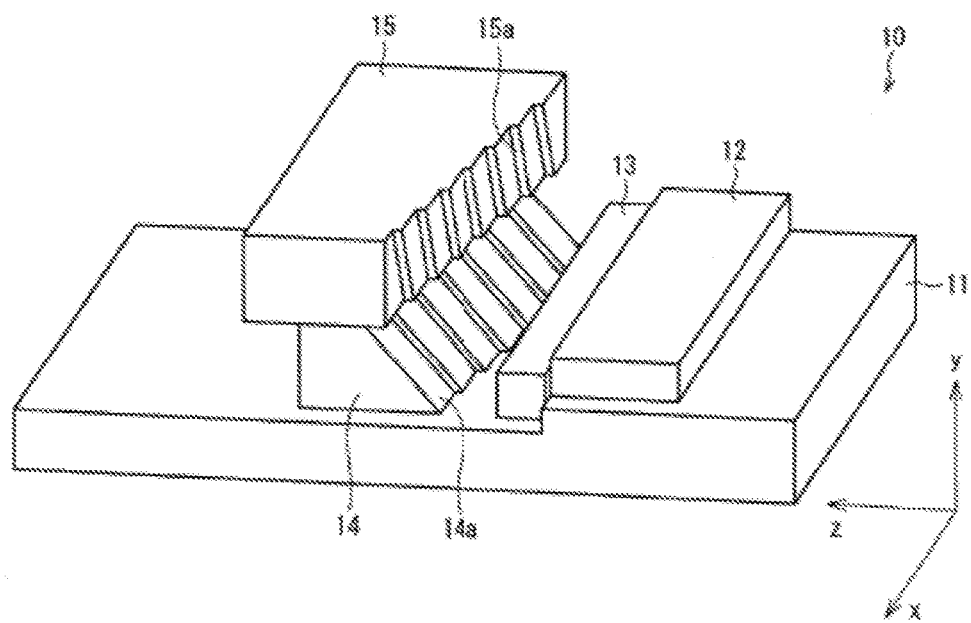

FIG. 12 is a perspective view illustrating a configuration of a conventional micro-optical device.

DESCRIPTION OF EMBODIMENTS

First Embodiment

The following discusses an LD module according to a First Embodiment of the present invention, with reference to drawings.

[Configuration of LD Module 1]

Figure 1:
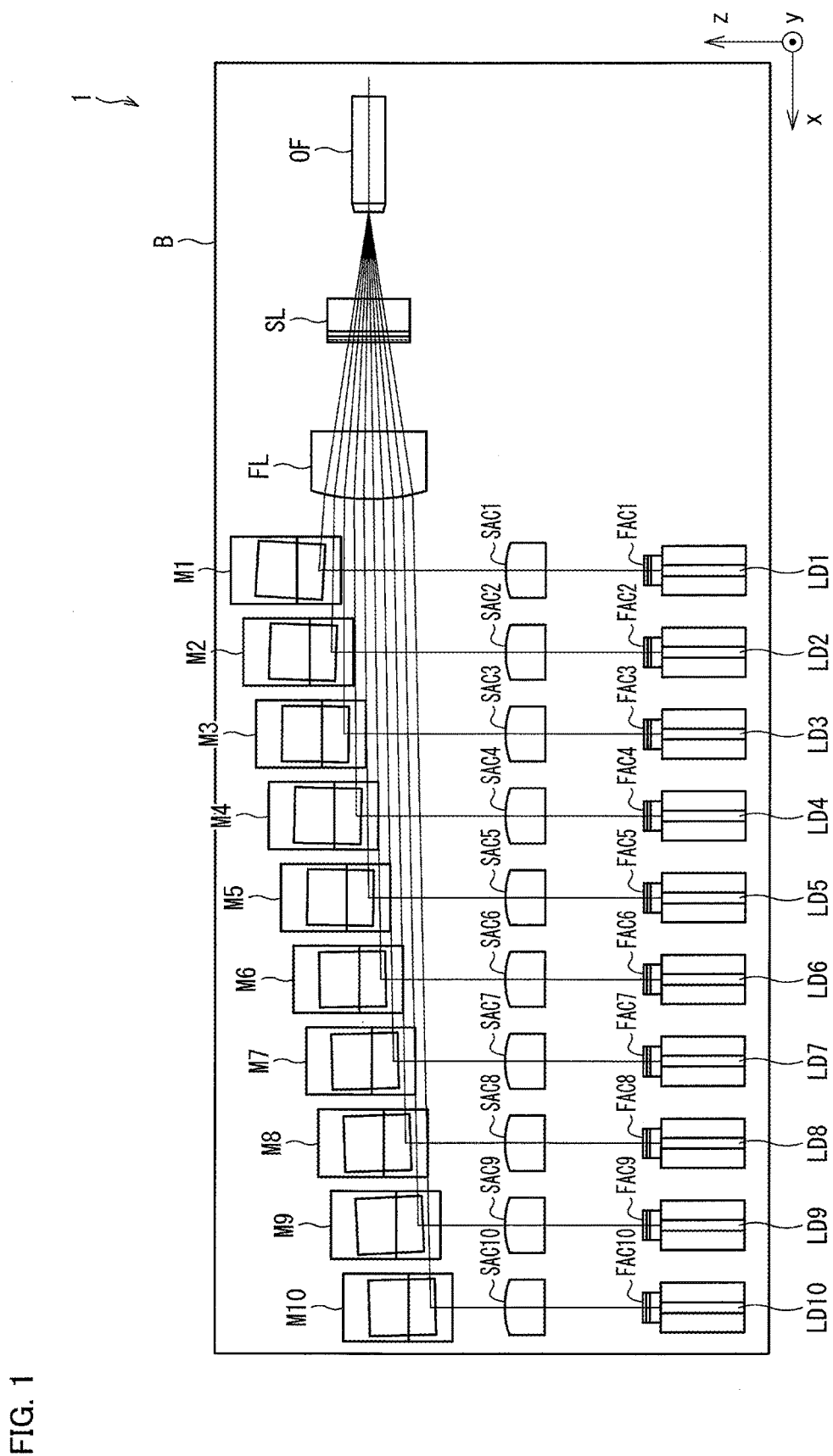
FIG. 1 is a plan view illustrating a configuration of an LD module according to First Embodiment of the present invention.
Figure 2:
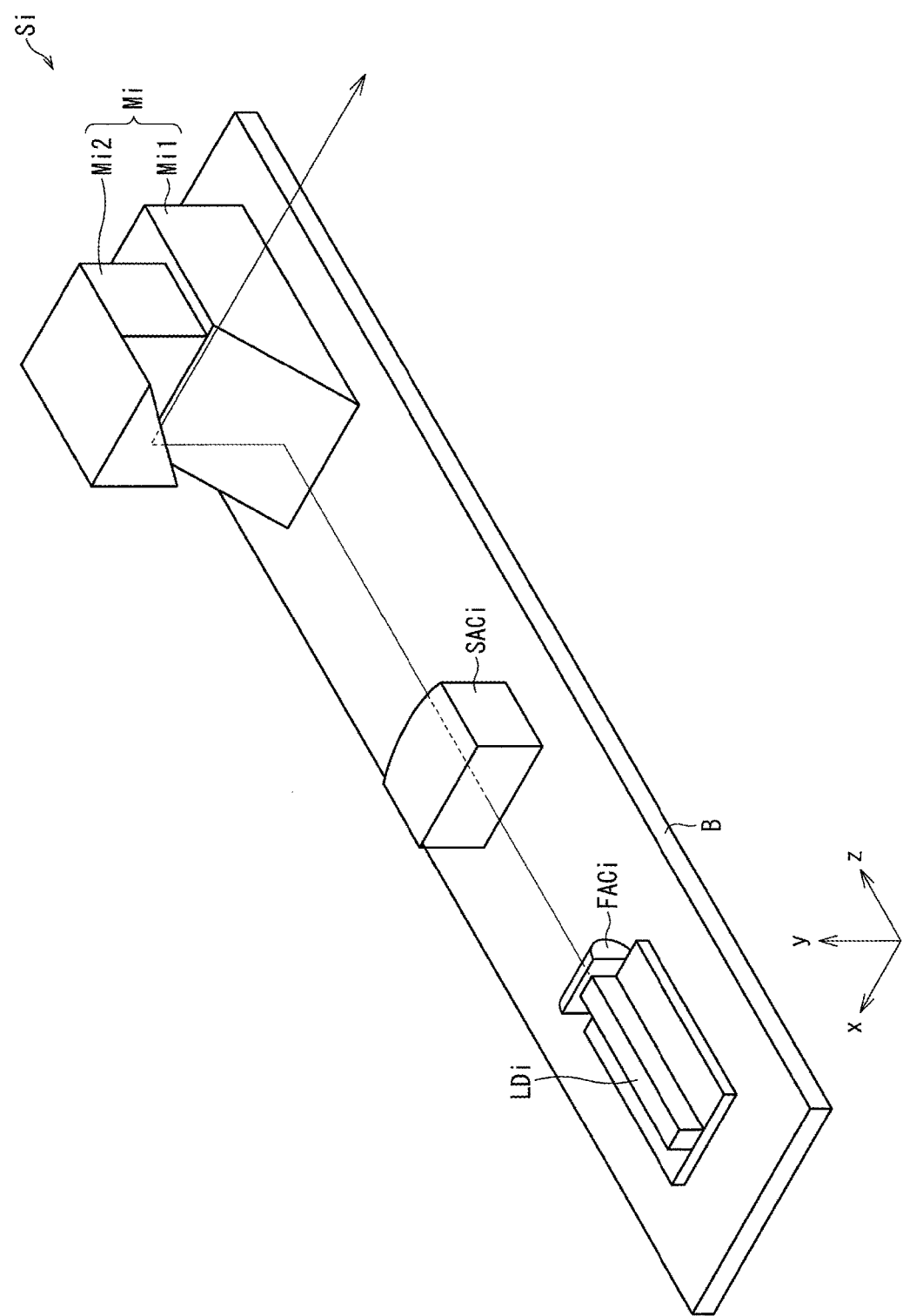
FIG. 2 is a perspective view illustrating a configuration of a unit optical system provided in the LD module illustrated in FIG. 1.

The following discusses a configuration of an LD module 1 according to the present embodiment, with reference to FIGS. 1 and 2. FIG. 1 is a plan view illustrating the configuration of the LD module 1. FIG. 2 is a perspective view illustrating a configuration of a unit optical system Si which constitutes the LD module 1.

The LD module 1 is a module for coupling laser beams emitted from N LD chips LD1 to LD10 (N=10 in the present embodiment) to an optical fiber OF. Note that in the present embodiment, the number N of the LD chips provided in the LD module 1 is 10, but in the present invention, the number is not limited to 10. In other words, the number N of LD chips provided in the LD module 1 can be any integer of two or more.

As illustrated in FIG. 1, the LD module 1 includes, in addition to the ten LD chips LD1 to LD10, ten F-axis collimating lenses FAC1 to FAC10, ten S-axis collimating lenses SAC1 to SAC10, ten double mirrors M1 to M10, a base plate B, an F-axis converging lens FL, and an S-axis light collecting lens SL. All of the LD chips LD1 to LD10, the F-axis collimating lenses FAC1 to FAC10, the S-axis collimating lenses SAC1 to SAC10, the double mirrors M1 to M10, the F-axis converging lens FL, and the S-axis light collecting lens SL are mounted on the base plate B directly or via a mount (not illustrated).

In the LD module 1, the base plate B, the F-axis collimating lenses FAC1 to FAC10, the S-axis collimating lenses SAC1 to SAC10, and the double mirrors M1 to M10 constitute a light-guiding device corresponding to the conventional micro-optical device 10 (see FIG. 12). This light-guiding device, like the conventional micro-optical device 10, functions to convert an input beam bundle made of laser beams (hereinafter, also referred to as "input beams") that are emitted from the LD chips LD1 to LD10 and propagating in a z-axis positive direction, to an output beam bundle made of laser beams (hereinafter, also referred to as "output beams") that propagates in a substantially x-axis negative direction.

In a light path of this output beam bundle, the F-axis converging lens FL and the S-axis light collecting lens SL are provided. The F-axis converging lens FL refracts the output beams constituting the output beam bundle so that intervals of the output beams in an F-axis direction become the smallest at an incident edge surface of the optical fiber OF (preferably, 0). Further, the F-axis converging lens FL collects the output beams constituting the output beam bundle so that a beam diameter in the F-axis direction becomes minimum at the incident edge surface of the optical fiber OF. On the other hand, the S-axis light collecting lens SL collects the output beams constituting the output beam bundle so that a beam diameter in an S-axis direction becomes minimum at the incident edge surface of the optical fiber OF.

As illustrated in FIG. 1, the LD module 1 includes an optical system, as a unit, that includes an LD chip LDi, an F-axis collimating lens FACi, an S-axis collimating lens SACi, and a double mirror Mi. FIG. 1 illustrates, as an example, a unit optical system S1 which includes the LD chip LD1, the F-axis collimating lens FAC1, the S-axis collimating lens SAC1, and the double mirror M1.

As illustrated in FIG. 2, each unit optical system Si constituting the LD module 1 includes an LD chip LDi, an F-axis collimating lens FACi, an S-axis collimating lens SACi, and a double mirror Mi.

As illustrated in FIG. 2, the LD chip LDi is mounted on the base plate B so that an active layer becomes parallel to a zx plane and an emission edge surface faces in the z-axis positive direction. Accordingly, a laser beam emitted from this LD chip LDi has a propagation direction that is parallel to the z-axis positive direction, an F axis that is parallel to a y axis, and an S axis that is parallel to an x axis.

Note that the N LD chips LD1 to LD10 are aligned along the x axis, as illustrated in FIG. 1. Therefore, optical axes of the laser beams emitted in the z-axis positive direction from the LD chips LDi are aligned in parallel to one another along the x axis in a first plane that is parallel to the zx plane.

As illustrated in FIG. 2, in a light path of the laser beam emitted from the LD chip LDi, the F-axis collimating lens FACi and the S-axis collimating lens SACi are provided. The F-axis collimating lens FACi is a lens for reducing, by collimation, a divergence of the laser beam emitted from the LD chip LDi in an F-axis direction. Meanwhile, the S-axis collimating lens SACi is a lens for reducing, by collimation, a divergence of the laser beam emitted from the LD chip LDi in an S-axis direction. The laser beam having transmitted the F-axis collimating lens FACi and the S-axis collimating lens SACi becomes a collimated beam whose propagation direction is converged in the z-axis positive direction. Note that in a case where the divergence of the laser beam emitted from the LD chip LDi in the S-axis direction is sufficiently small, the S-axis collimating lens SACi can be omitted.

As illustrated in FIG. 2, in the light path of the laser beam emitted from the LD chip LDi, the double mirror Mi is further provided. The double mirror Mi is made of a first mirror Mi1 mounted on the base plate B and a second mirror Mi2 mounted on the first mirror Mi1. The first mirror Mi1 reflects the laser beam emitted from the LD chip LDi, and changes the propagation direction of the laser beam from the z-axis positive direction to a y-axis positive direction. The first mirror Mi1 is also called a "flip-up mirror". Further, the second mirror Mi2 reflects the laser beam that has been reflected by the first mirror Mi1 so that the propagation direction of the laser beam is changed from the y-axis positive direction to a substantially x-axis negative direction. The second mirror Mi2 is also called a "folding mirror".

Note that as illustrated in FIG. 1, a double mirror Mi+1 that reflects a laser beam emitted from an (i+1)th LD element Di+1 (as counted in a direction from an x-axis negative side to an x-axis positive side) is provided on a z-axis negative direction side of a double mirror Mi that reflects a laser beam emitted from an i-th LD element Di (as counted in the direction from the x-axis negative side to the x-axis positive side). On this account, optical axes of the laser beams reflected by these double mirrors Mi in the substantially x-axis negative direction are aligned in a second plane that is parallel to the zx plane. This second plain is at a position that is on a y-axis positive direction side of the first plane as described above.

A point to be noted in the LD module 1 is that extensions of optical axes of the output beams that have been reflected by these double mirrors Mi and have not been converged by the F-axis converging lens FL intersect with one another at a single point. In this way, the LD module 1 brings about at least the following advantageous effects.

(1) A distance between the F-axis converging lens FL and an intersection of the beams can be reduced as compared with a case in which an interval of optical axes of each adjacent ones of the output beams is constant (that is, a case in which optical axes of the output beams are aligned in parallel to one another). In other words, the intersection of the beams can be formed closer to the F-axis converging lens FL than a focal point (an intersection of the beams in the case where the interval of the optical axes of each adjacent ones of the output beams is constant) of the F-axis converging lens FL is. This allows the incident edge surface of the optical fiber OF to be closer to the F-axis converging lens FL as compared with the case in which the interval of the optical axes of each adjacent ones of the output beams is constant. This consequently makes it possible to reduce a size of the LD module 1.

(2) A distance between an optical axis of the F-axis converging lens FL and the optical axis of each of the output beams can be reduced as compared with a case in which the interval of the optical axes of each adjacent ones of the output beams is constant. In this way, a convergence of the output beam bundle and a convergence of the output beams are not interfered by an aberration of the F-axis converging lens FL. This consequently makes it possible to improve a coupling efficiency between the LD chips LD1 to LD10 and the optical fiber OF in the LD module 1.

(3) Each of the output beams constituting the output beam bundle and having been converged by the F-axis converging lens FL has a smaller incident angle at the time of entering the optical fiber OF, as compared with the case in which the interval of the optical axes of each adjacent ones of the output beams is constant. This makes it possible to use an F-axis converging lens FL having a smaller radius of curvature, without inviting a decrease in coupling efficiency. This consequently makes it possible to reduce the size of the LD module 1.

[Configuration of Double Mirror]

Figure 3:
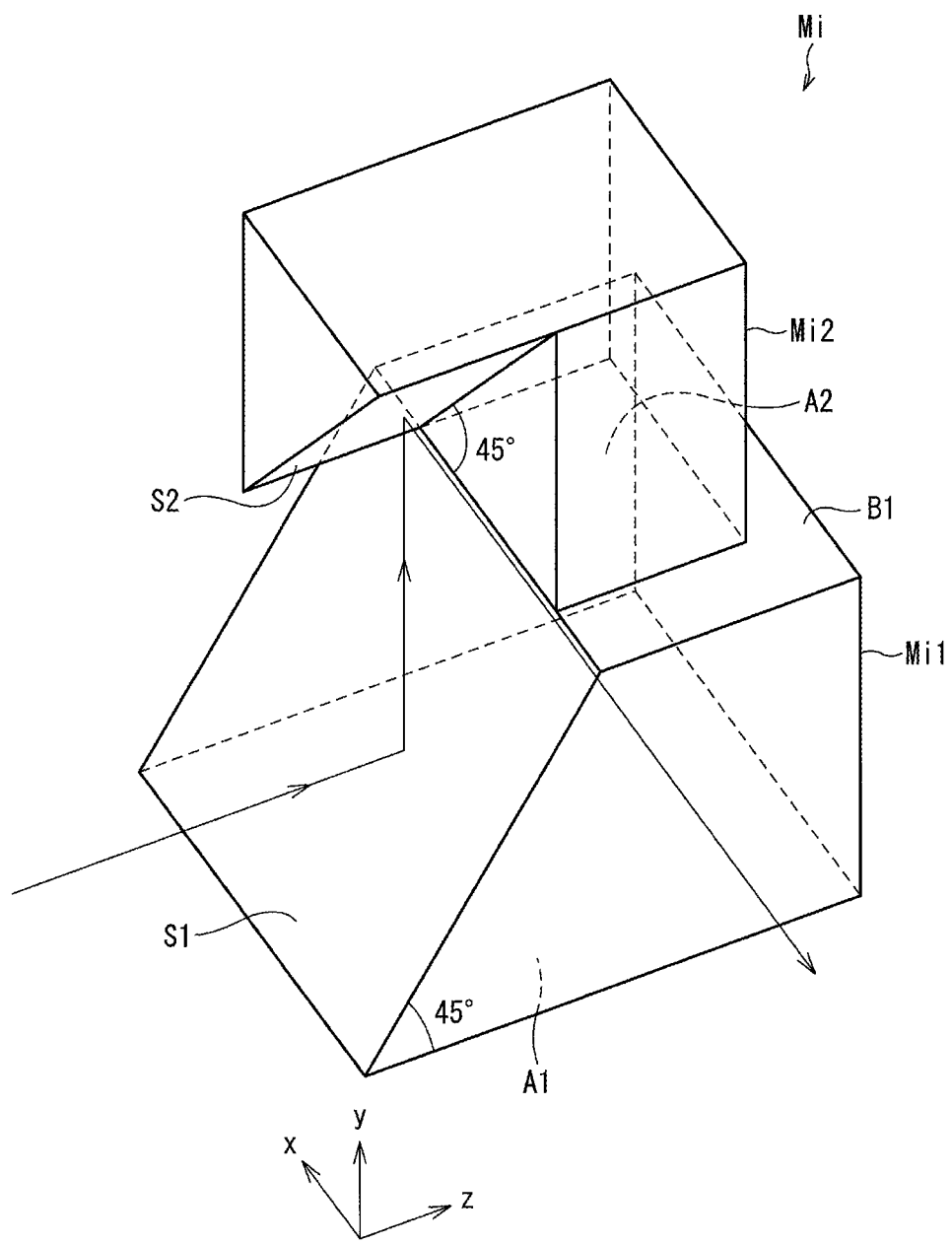
FIG. 3 is a perspective view illustrating a configuration of a double mirror provided in the LD module illustrated in FIG. 1.

The following discusses a configuration of the double mirror Mi provided in the LD module 1, with reference to FIG. 3. FIG. 3 is a perspective view illustrating the configuration of the double mirror Mi. As illustrated in FIG. 3, the double mirror Mi is made of a first mirror Mi1 and a second mirror Mi2.

The first mirror Mi1 is a polyhedral structure that has a bottom surface A1, a top surface B1 parallel to the bottom surface A1, and a reflective surface S1. The reflective surface S1 and the bottom surface A1 makes an angle of 45°, as illustrated in FIG. 3.

The first mirror Mi1 is mounted on the base plate B so that the bottom surface A1 abuts a top surface of the base plate B (see FIG. 2). As a result, a normal vector of the reflective surface S1 of the first mirror Mi1 (an outward normal vector pointing toward outside the first mirror Mi1 from the reflective surface S1) and a normal vector of the top surface (zx plane) of the base plate B (an outward normal vector pointing toward outside the base plate B from the top surface of the base plate B) makes an angle of 45°. Further, an orientation of the first mirror Mi1 is determined so that a normal of the reflective surface S1 becomes parallel to a yz plane. As a result, the reflective surface S1 of the first mirror Mi1 reflects an incident laser beam from the z-axis negative direction into the y-axis positive direction.

The second mirror Mi2 is a polyhedral structure that has at least a bottom surface A2 and a reflective surface S2. The reflective surface S2 and the bottom surface A2 makes an angle of 45° as illustrated in FIG. 3.

The second mirror Mi2 is mounted on the first mirror Mi1 so that the bottom surface A2 abuts the top surface B1 of the first mirror Mi1. As a result, a normal vector of the reflective surface S2 of the second mirror Mi2 (an outward normal vector pointing toward outside the second mirror Mi2 from the reflective surface S2) and the normal vector of the top surface (zx plane) of the base plate B (the outward normal vector pointing toward outside the base plate B from the top surface of the base plate B) makes an angle of 135°. Further, an orientation of the second mirror Mi2 is determined so that a normal of the reflective surface S2 becomes substantially parallel to an xy plane. As a result, the reflective surface S2 of the second mirror Mi2 reflects an incident laser beam from a y-axis negative direction into a substantially x-axis negative direction.

In the double mirror Mi, minute rotation of an orientation of the first mirror Mi1 around the y axis as a rotation axis causes minute rotation of the propagation direction of a corresponding output beam around the z axis as a rotation axis. Further, minute rotation of an orientation of the second mirror Mi2 around the y axis as a rotation axis causes minute rotation of the propagation direction of a corresponding output beam around the y axis as a rotation axis. On this account, according to the double mirror Mi, appropriately setting the orientations of the first mirror Mi1 and the second mirror Mi2 makes it possible to cause a corresponding output beam to propagate in a desired direction.

In the LD module 1, the orientation of the first mirror Mi1 provided in each of the double mirrors M1 to M10 is set so that optical axes of the output beams become parallel to the zx plane. Meanwhile, the orientation of the second mirror Mi2 provided in each of the double mirrors M1 to M10 is set so that extensions of the optical axes of the output beams prior to being converged by the F-axis converging lens FL intersect with one another at a single point.

Note that in the present embodiment, a configuration in which the second mirror Mi2 is mounted on the first mirror i1 has been discussed, but the present invention is not limited to this. That is, a configuration in which the second mirror Mi2 is integrated with the first mirror Mi1 can be employed as long as a position of the reflective surface S2 relative to the reflective surface S1 is identical to that of the present embodiment. Further, in the present embodiment, a configuration in which the double mirror Mi is provided separately from another double mirror Mj has been discussed, but the present invention is not limited to this. That is, a configuration in which the double mirror Mi is integrated with the another double mirror Mj can be employed as long as a position of the double mirror Mi relative to the another double mirror Mj is identical to that of the present embodiment. Further, it is possible to employ a configuration in which, like the micro-optical device 10 illustrated in FIG. 12, second mirrors M12 to M102 which are integrated with one another are mounted on first mirrors M11 to M101 which are integrated with one another.

[Orientation of Second Mirror]

Figure 4:
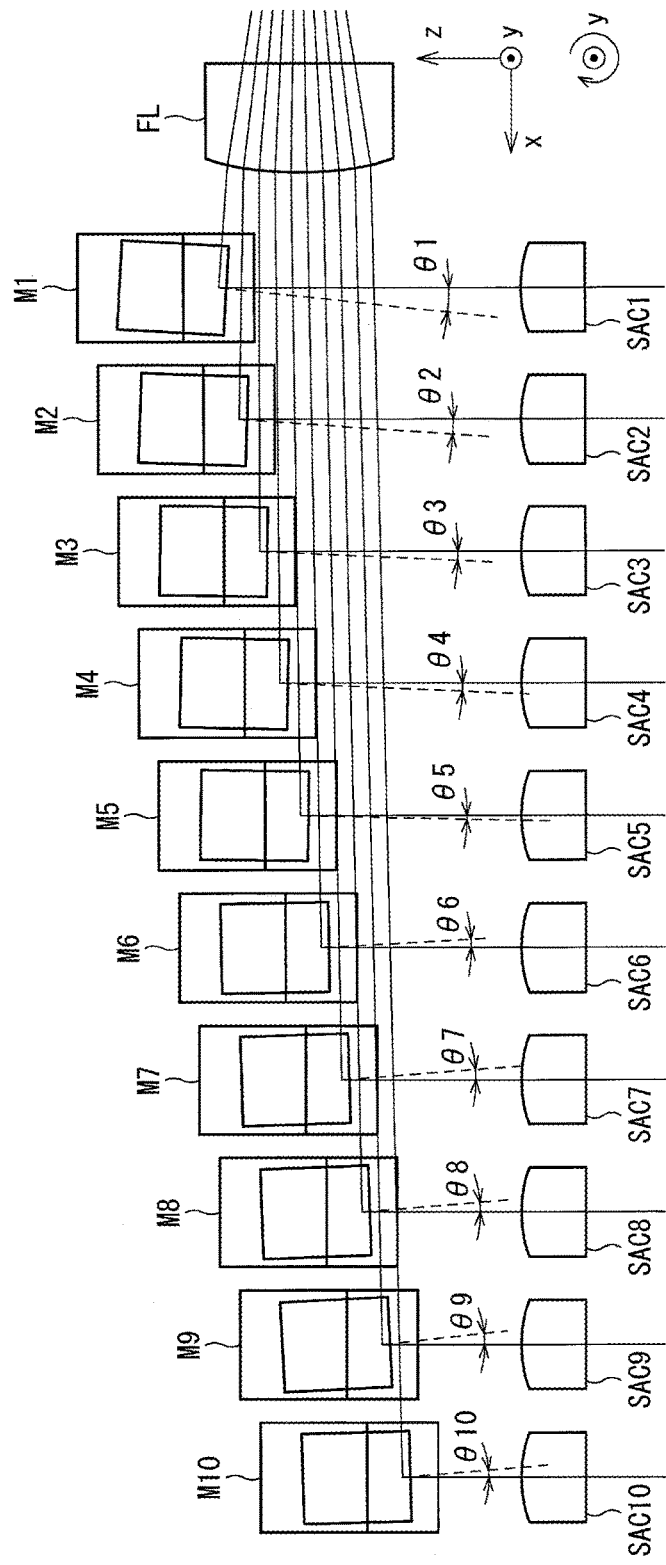
FIG. 4 is a view for illustrating a rotation angle of a second mirror provided in the double mirror illustrated in FIG. 3 at the time when minute rotation of a propagation direction of each output beam is caused by minute rotation of the second mirror.

The following discusses the orientation of the second mirror Mi2 provided in each of the double mirrors M1 to M10, with reference to FIG. 4. FIG. 4 is a plan view illustrating the orientation of the second mirror Mi2 provided in each of the double mirrors M1 to M10. Note that in the following description, θi is a rotation angle by which the second mirror Mi2, the orientation of which is determined so that the normal of the reflective surface S2 (see FIG. 3) becomes parallel to the yz plane, is rotated around the y axis as a rotation axis. At this time, clockwise rotation as viewed against the y-axis positive direction is defined as rotation in a positive direction.

In the present embodiment, optical axes of the input beams are aligned in parallel to one another at equal intervals. As such, by setting the rotation angle θi of each second mirror Mi2 as shown in a table below, the optical axes of the output beams are caused to intersect with one another at a single point.

TABLE 1

| i | Rotation Angle θi |
|---|---|
| 1 | 1.000 |
| 2 | 0.666 |
| 3 | 0.371 |
| 4 | 0.109 |
| 5 | −0.125 |
| 6 | −0.335 |
| 7 | −0.525 |
| 8 | −0.698 |
| 9 | −0.856 |
| 10 | −1.000 |

Note that it is possible to employ a configuration in which, by setting the orientation of each second mirror Mi2 so as to satisfy an equation $\theta i = \theta - \Delta \times (i-1)$, the optical axes of the output beams are caused to intersect with one another at a single point. In this equation, θ is a predetermined positive angle (e.g., 1°), and the second mirror M12, which is the closest to the x-axis negative side, has a rotation angle $\theta 1 = \theta$. Further, Δ is a positive angle represented by $\Delta = 2\theta/(N-1) = 2\theta/9$, and the second mirror M102, which is the closest to the x-axis positive side, has a rotation angle $\theta 10 = -\theta$. Note that in this case, intervals of the optical axes of the input beams become irregular.

Note, however, that excessively increasing a value of a maximum rotation angle θ in a case where the orientation of each second mirror Mi2 is set as described above causes an intersection of the beams to be formed inside the F-axis converging lens FL. This makes it impossible to cause the intersection of the beams to be formed on the incident edge surface of the optical fiber OF. It is therefore preferable to determine the value of θ by taking account of this point.

Figure 5:
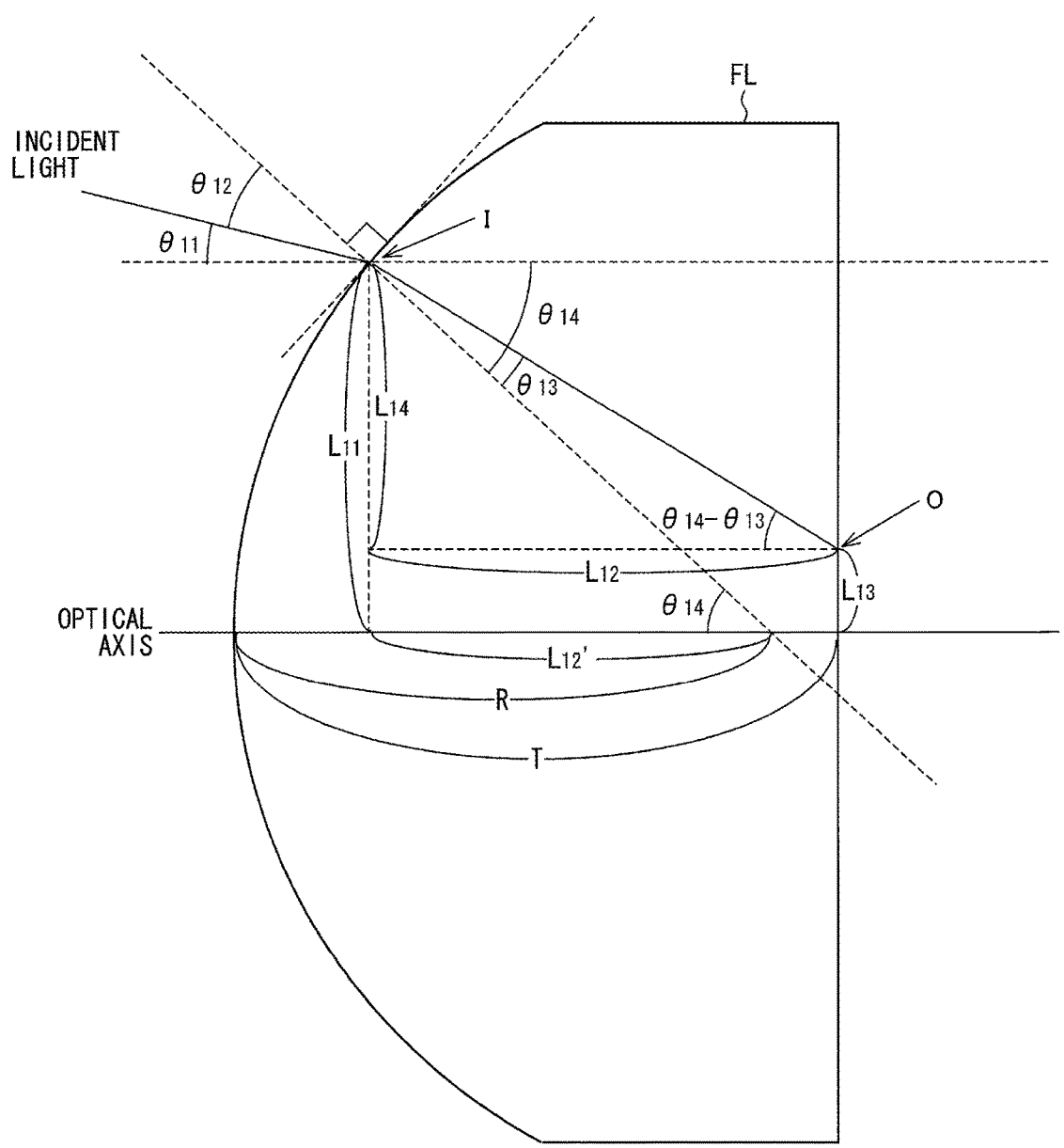
FIG. 5 is a view for illustrating a condition for output beams to intersect with each other at a single point located on an x-axis positive side with respect to an F-axis converging lens, at the time when the minute rotation of the propagation direction of each output beam illustrated in FIG. 4 is performed.

The following discusses, with reference to FIG. 5, a condition given to the maximum rotation angle θ in order for the intersection of the beams to be formed outside the F-axis converging lens FL. FIG. 5 is a cross-sectional view illustrating a cross-sectional surface of the F-axis converging lens FL.

The F-axis converging lens FL is a cylindrical lens (plano-convex cylindrical lens) having a refractive index n, a radius of curvature R, and a thickness T. Further, an output beam reflected by the second mirror M12 enters the F-axis converging lens FL via a point I (hereinafter, also referred to as "incident point I") on an incident surface (convex surface) of the F-axis converging lens FL, and exits the F-axis converging lens FL via a point O (hereinafter, also referred to as "exit point O") on an exit surface (flat surface) of the F-axis converging lens FL. A distance between the incident point I and the optical axis of the F-axis converging lens FL is indicated as $L_{11}$, and an angle made by the output beam reflected by the second mirror M12 and the optical axis of the F-axis converging lens FL is indicated as $\theta_{11}$. $\theta_{11}$ is equal to the rotation angle θ1 of the second mirror M12=θ.

A condition for the intersection of the beams to be formed outside the F-axis converging lens FL is that a distance $L_{13}$ between the exit point O and the optical axis of the F-axis converging lens FL has a positive value. As such, if a relationship between $L_{13}$ and $\theta_{11}=\theta$ is clarified, the condition given to the maximum rotation angle $\theta=\theta_{11}$ in order for the intersection of the beams to be formed outside the F-axis converging lens FL will be clarified. In the following description, the relationship between $L_{13}$ and $\theta_{11}=\theta$ will be clarified.

In a case where $L_{14}$ is defined as illustrated in FIG. 5, $L_{13}=L_{11}-L_{14}$. In a case where $L_{12}$, $\theta_{14}$, and $\theta_{13}$ are defined as illustrated in FIG. 5, $L_{14}=L_{12}\tan(\theta_{14}-\theta_{13})$. In a case where $L_{12}'$ is defined as illustrated in FIG. 5, $L_{12}=T-(R-L_{12}')$. Therefore, $L_{13}=L_{11}-\{T-(R-L_{12}')\}\tan(\theta_{14}-\theta_{13})$.

$L_{12}'$ is represented by the following formula (1).

[Math 1]

$$L_{12}' = \frac{L_{11}}{\tan\theta_{14}} \quad (1)$$

$\theta_{13}$ is represented by the following formula (2) according to Snell's law, where $n_0$ is a refractive index of the air.

[Math 2]

$$\theta_{13} = \sin^{-1}\left[\frac{n_0}{n}\sin\left\{\sin^{-1}\left(\frac{L_{11}}{R}\right) - \theta_{13}\right\}\right] \quad (2)$$

$\theta_{14}$ is represented by the following formula (3).

[Math 3]

$$\theta_{14} = \sin^{-1}\left(\frac{L_{11}}{R}\right) \quad (3)$$

Therefore, the relationship between $L_{13}$ and $\theta_{11}=\theta$ is represented by the following formula (4).

[Math 4]

$$L_{13} = L_{11} - \left\{T - R + \frac{L_{11}}{\sin^{-1}\left(\frac{L_{11}}{R}\right)}\right\} \quad (4)$$

$$\left(\sin^{-1}\left(\frac{L_{11}}{R}\right) - \sin^{-1}\left[\frac{n_0}{n}\sin\left\{\sin^{-1}\left(\frac{L_{11}}{R}\right) - \theta_{11}\right\}\right]\right)$$

That is, the condition given to the maximum rotation angle $\theta=\theta_{11}$ in order for the intersection between the beams to be formed outside the F-axis converging lens FL is represented by the following formula (5).

[Math 5]

$$L_{11} - \left\{T - R + \frac{L_{11}}{\sin^{-1}\left(\frac{L_{11}}{R}\right)}\right\} \quad (5)$$

$$\left(\sin^{-1}\left(\frac{L_{11}}{R}\right) - \sin^{-1}\left[\frac{n_0}{n}\sin\left\{\sin^{-1}\left(\frac{L_{11}}{R}\right) - \theta_{11}\right\}\right]\right) > 0$$

[Verification of Effect]

Even in a configuration in which the optical axes of the output beams constituting the output beam bundle are aligned in parallel to one another, the intersection of the beams can be formed in a position closer to the F-axis converging lens FL by reducing the radius of curvature of the F-axis converging lens FL. In this case, however, a coupling efficiency with which the output beam bundle enters the optical fiber OF decreases. In contrast, by employing a configuration in which the optical axes of the output beams constituting the output beam bundle are caused to intersect with one another at a single point, it is possible to suppress the decrease in coupling efficiency. The following verifies this point with reference to FIG. 6.

Figure 6:
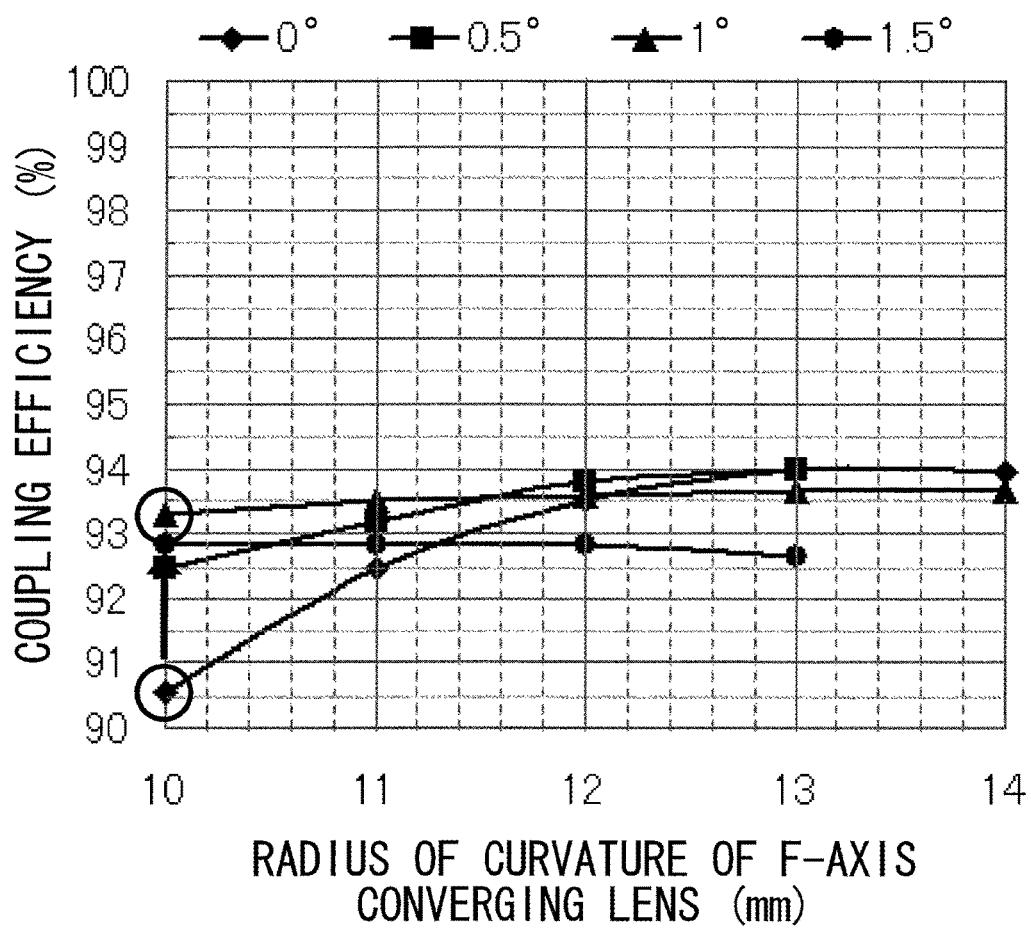
FIG. 6 is a graph showing a relationship between (i) a radius of curvature of an F-axis converging lens and (ii) a coupling efficiency of an output beam bundle to an optical fiber in a case where a rotation angle of a second mirror is changed.

FIG. 6 is a graph showing a relationship between (i) the radius of curvature of the F-axis converging lens FL and (ii) a coupling efficiency with which the output beam bundle enters the incident edge surface of the optical fiber OF. In the graph of FIG. 6, a horizontal axis represents the radius of curvature (unit: mm) of the F-axis converging lens FL, and a vertical axis represents the coupling efficiency (unit: %) with which the output beam bundle is caused to enter the optical fiber OF. FIG. 6 shows coupling efficiencies corresponding to cases where the maximum rotation angle θ is 0°, 0.5°, 1°, and 1.5°, respectively. Note that each of the coupling efficiencies shown in FIG. 6 is a coupling efficiency obtained in a case where the incident edge surface of the optical fiber OF is located at the intersection of the beams.

As shown in FIG. 6, in the case where maximum rotation angle θ is 0°, that is, in a case where the optical axes of the output beams are aligned in parallel to one another, the coupling efficiency of the output beam bundle to the optical fiber OF decreases as the radius of curvature of the F-axis converging lens FL is reduced. A cause of this decrease in coupling efficiency is, for example, that an increase in incidence angle at which each of the output beams enters the incident edge surface of the optical fiber OF results in more components that enter the incident edge surface at an angle exceeding an acceptance angle of the optical fiber.

Also in a case where the maximum rotation angle θ is a positive angle, that is, in a case where optical axes of the output beams intersect with one another at a single point, the coupling efficiency of the output beam bundle to the optical fiber OF decreases as the radius of curvature of the F-axis converging lens FL is reduced. However, the coupling efficiency decreases to a smaller extent as compared with the case in which the maximum rotation angle θ is 0°. In particular, in the case where the maximum rotation angle θ is 1°, the coupling efficiency corresponding to the radius of curvature of 10 mm of the F-axis converging lens FL has a value that is as much as about 3% higher than that of the case where the maximum rotation angle θ is 0°. This is assumed to be due to a smaller incidence angle at which each of the output beams enters the incident edge surface of the optical fiber OF, as compared with the case in which the maximum rotation angle θ is 0°.

Figure 7:
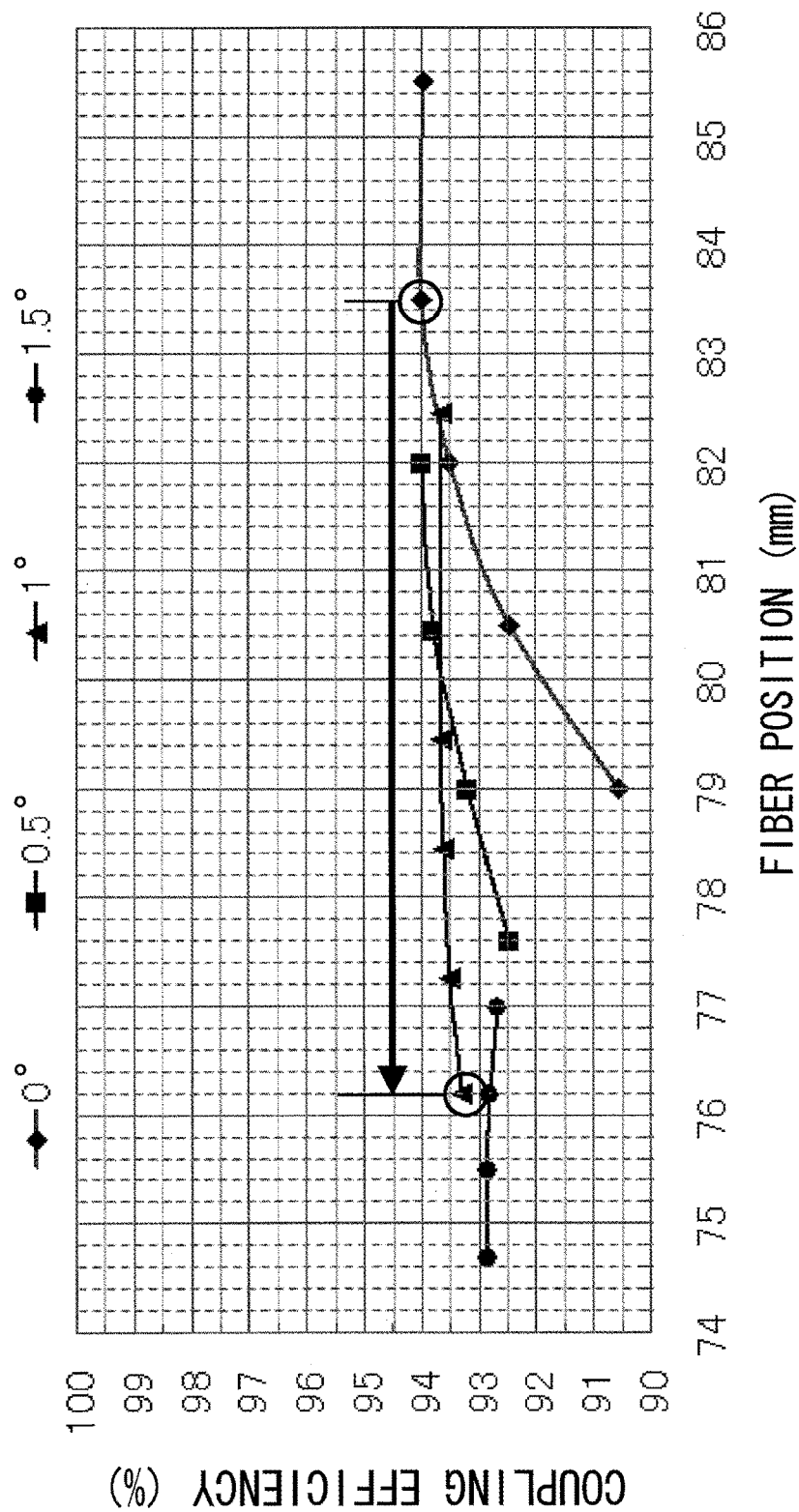
FIG. 7 is a graph showing a relationship between (i) a position of an optical fiber and (ii) a coupling efficiency of an output beam bundle to an optical fiber in a case where a rotation angle of a second mirror is changed.

The following verifies, with reference to FIG. 7, that the configuration in which the output beams constituting the output beam bundle are caused to intersect with one another at a single point allows the incident edge surface of the optical fiber OF to be located closer to the F-axis converging lens FL, without inviting a significant decrease in coupling efficiency.

FIG. 7 is a graph showing a relationship between (i) a fiber position and (ii) a coupling efficiency with which the output beam bundle enters the incident edge surface of the optical fiber OF. Note that the fiber position denotes a distance between (i) a straight line that is parallel to a z axis and passes through a center of the LD chip LD1 and (ii) the incident edge surface of the optical fiber OF. In the graph of FIG. 7, a horizontal axis represents the fiber position (unit: mm), and a vertical axis represents the coupling efficiency (unit: %) with which the output beam bundle is caused to enter the optical fiber OF. FIG. 7 also shows coupling efficiencies corresponding to cases where the maximum rotation angle θ is 0°, 0.5°, 1°, and 1.5°, respectively. Note that each of the coupling efficiencies shown in FIG. 7 is a coupling efficiency obtained in a case where the radius of curvature of the F-axis converging lens FL is set so that the intersection of the beams is formed on the incident edge surface of the optical fiber OF.

In the case where the maximum rotation angle θ is 0°, that is, in a case where the optical axes of the output beams are aligned in parallel to one another, the coupling efficiency of the output beam bundle to the optical fiber OF decreases as the incident edge surface of the optical fiber OF becomes closer to the exit surface of F-axis converging lens FL. A cause of this decrease in coupling efficiency can be, for example, that an increase in incidence angle at which each of the output beams enters the incident edge surface of the optical fiber OF results in more components that enter the incident edge surface at an angle exceeding the acceptance angle of the optical fiber.

Also in a case where the maximum rotation angle θ is a positive angle, that is, in a case where the optical axes of the output beams intersect with one another at a single point, the coupling efficiency of the output beam bundle to the optical fiber OF decreases as the incident edge surface of the optical fiber OF becomes closer to the exit surface of F-axis converging lens FL. However, the coupling efficiency decreases to a smaller extent as compared with the case in which the maximum rotation angle θ is 0°. In particular, a comparison of the case where the maximum rotation angle θ is 0° and the case where the maximum rotation angle θ is 1° shows that the incident edge surface of the optical fiber OF can be brought closer to the exit surface of the F-axis converging lens FL by as much as 7 mm while the decrease in coupling efficiency is suppressed to less than 1%. This is assumed to be due to a smaller incidence angle at which each of the output beams enters the incident edge surface of the optical fiber OF, as compared with the case in which the maximum rotation angle θ is 0°.

[Modified Examples]

Figure 8:
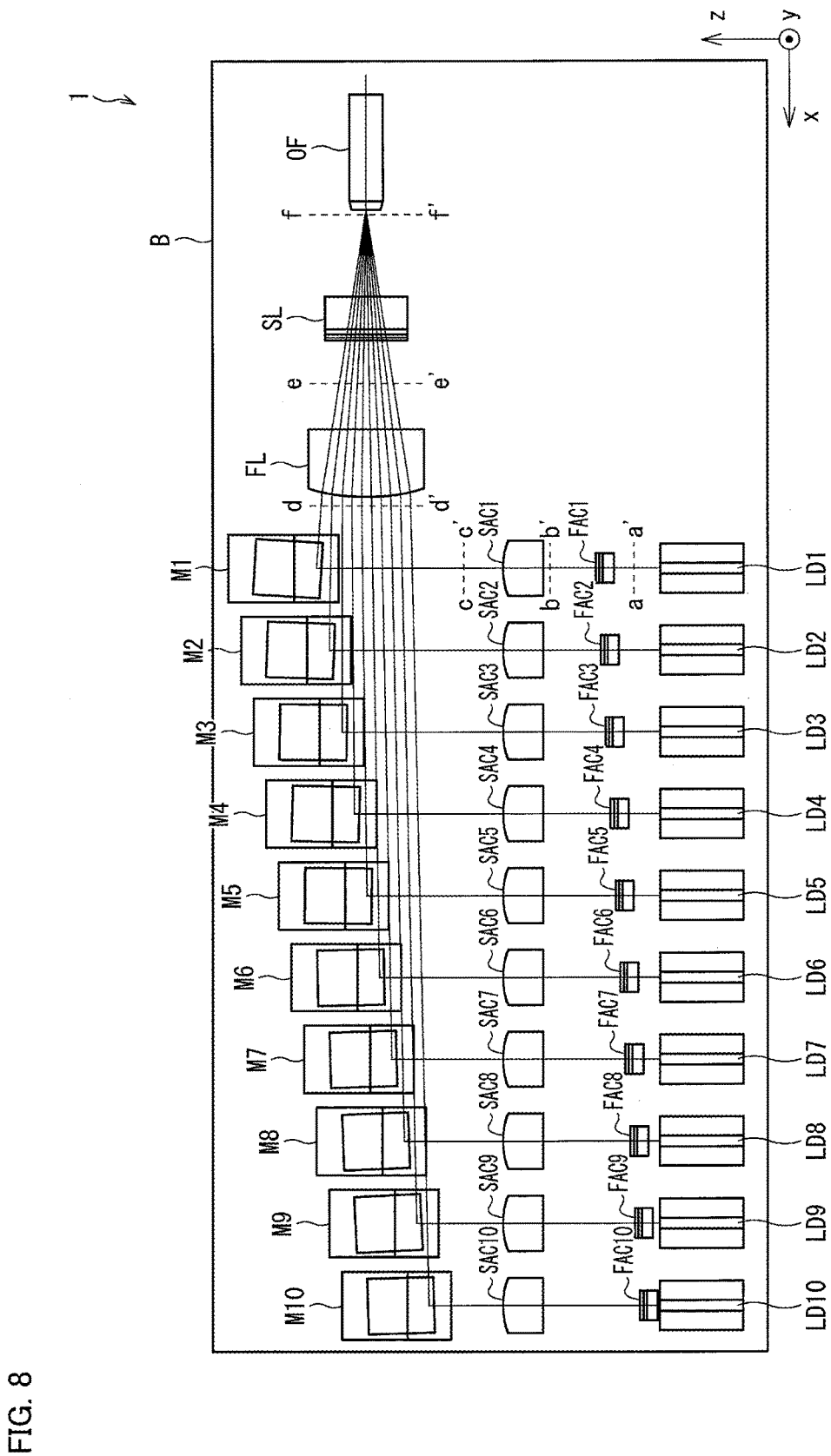
FIG. 8 is a plan view illustrating a modified example of the LD module illustrated in FIG. 1.
Figure 9:
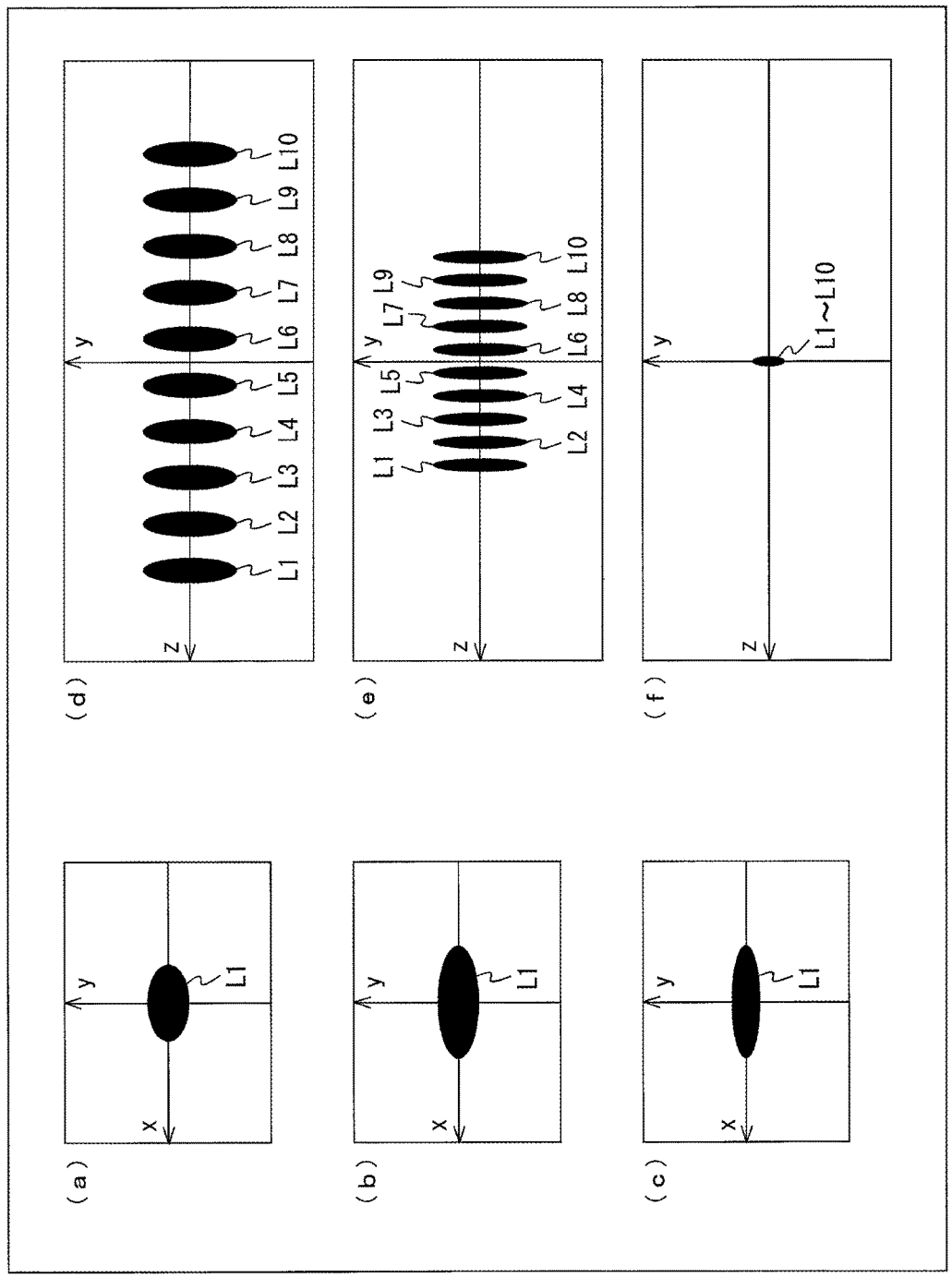
FIG. 9 is a view illustrating changes observed in shape of each output beam in a case where the LD module illustrated in FIG. 8 is used. (a) of FIG. 9 is a view illustrating a shape of the output beam on an a-a' cross-sectional surface taken along a line a-a' in FIG. 8. (b) of FIG. 9 is a view illustrating a shape of the output beam on a b-b' cross-sectional surface taken along a line b-b' in FIG. 8. (c) of FIG. 9 is a view illustrating a shape of the output beam on a c-c' cross-sectional surface taken along a line c-c' in FIG. 8. (d) of FIG. 9 is a view illustrating an output beam bundle on a d-d' cross-sectional surface taken along a line d-d' in FIG. 8. (e) of FIG. 9 is a view illustrating the output beam bundle on an e-e' cross-sectional surface taken along a line e-e' in FIG. 8. (f) of FIG. 9 is a view illustrating a shape of the output beam bundle on an f-f' cross-sectional surface taken along a line f-f' in FIG. 8.

The following discusses modified examples of the LD module 1 according to the present embodiment, with reference to FIGS. 8 and 9. FIG. 8 is a plan view illustrating a modified example of the LD module 1. FIG. 9 is a view illustrating changes observed in shape of each of output beams in a case where an LD module 1 illustrated in FIG. 8 is used.

The LD module 1 according to the present modified example employs a configuration in which, as illustrated in FIG. 8, a position of an F-axis collimating lens FACi is offset from a reference position in a z-axis positive direction (i.e., a propagation direction of laser light emitted from an LD chip LDi). Note that the reference position denotes a position at which the F-axis collimating lens FACi exhibits a function of parallelizing (collimating) a divergence, in an F-axis direction, of a beam of laser light emitted from the LD chip LDi. The F-axis collimating lens FACi having been offset from the reference position in the propagation direction of the laser light exhibits a function of collecting laser light emitted from the LD chip LDi, that is, a function of gradually reducing a beam diameter of the laser light.

A laser beam emitted from the LD chip LDi propagates in the z-axis positive direction while diverging in the F-axis direction (a direction parallel to a y axis) and an S-axis direction (a direction parallel to an x axis), until the laser beam enters the F-axis collimating lens FACi. (a) of FIG. 9 is a view illustrating a shape of a laser beam on an a-a' cross-sectional surface taken along a line a-a' in FIG. 8. As illustrated in (a) of FIG. 9, a beam spot L1 of the laser beam emitted from an LD chip LD1 is a beam spot that diverges in the F-axis direction and the S-axis direction.

The laser beam emitted from LD1 enters an F-axis collimating lens FAC1 and is collected in the F-axis direction. The laser beam emitted from the F-axis collimating lens FAC1 propagates in the z-axis positive direction while a beam diameter of the laser beam in the F-axis direction gradually decreases. (b) of FIG. 9 is a view illustrating a shape of the laser beam on a b-b' cross-sectional surface taken along a line b-b' in FIG. 8. As illustrated in (b) of FIG. 9, a beam diameter, in the F-axis direction, of the beam spot L1 on the b-b' cross-sectional surface is smaller than that of the beam spot L1 on the a-a' cross-sectional surface.

The laser beam emitted from the F-axis collimating lens FAC1 enters the S-axis collimating lens SAC1 and is collimated in the S-axis direction. The laser beam emitted from the S-axis collimating lens SAC1 propagates in the z-axis positive direction while the beam diameter of the laser beam in the F-axis gradually decreases. (c) of FIG. 9 is a view illustrating a shape of the output beam on a c-c' cross-sectional surface taken along a line c-c' in FIG. 8. As illustrated in (c) of FIG. 9, a beam diameter, in the F-axis direction, of a beam spot L1 on the c-c' cross-sectional surface is smaller than that of the beam spot L1 on the b-b' cross-sectional surface.

A laser beam emitted from each of the S-axis collimating lens SAC1 to SAC10 enters a corresponding double mirror Mi, and a propagation direction, an F-axis direction, and an S-axis direction of the laser beam are changed to a substantially x-axis direction, a substantially z-axis direction, and a substantially y-axis direction, respectively. An output beam bundle constituted by laser beams (output beams) emitted from respective double mirrors M1 to M10 propagates in an x-axis negative direction while (i) a beam diameter, in an F-axis direction, of each of the output beams gradually decreases and (ii) intervals of optical axes of the output beams gradually decrease. (d) of FIG. 9 is a view illustrating the output beam bundle on a d-d' cross-sectional surface taken along a line d-d' in FIG. 8. As illustrated in (d) of FIG. 9, beam spots L1 to L10 of the output beams constituting the output beam bundle are aligned on a surface that is parallel to a zx plane. Further, as illustrated in (d) of FIG. 9, a beam diameter, in the F-axis direction of, each beam spot Li on the d-d' cross-sectional surface is smaller than that of a corresponding beam spot Li on the c-c' cross-sectional surface.

The output beam bundle constituted by the output beams emitted from the double mirrors M1 to M10 enters an F-axis converging lens FL, and is converged in the F-axis direction. The output beam bundle emitted from the F-axis converging lens FL propagates in the x-axis negative direction while (i) the beam diameter, in the F-axis direction, of each of the output beams gradually decreases and (ii) intervals of optical axes of the output beams gradually decrease. (e) of FIG. 9 is a view illustrating the output beam bundle on an e-e' cross-sectional surface taken along a line e-e' in FIG. 8. As illustrated in (e) of FIG. 9, a beam diameter, in the F-axis direction, of each beam spot Li on the e-e' cross-sectional surface is smaller than that of a corresponding beam spot Li on the d-d' cross-sectional surface. Further, an interval between an optical axis of a beam spot Li and an optical axis of a beam spot Li+1 on the e-e' cross-sectional surface is smaller than that on the d-d' cross-sectional surface.

The output beam bundle emitted from the F-axis converging lens FL enters an S-axis light collecting lens SL, and is further collected in the S-axis direction. The output beam bundle emitted from the S-axis light collecting lens SL propagates in the x-axis negative direction while (i) beam diameters in the F-axis direction and the S-axis direction of each of the output beams are gradually decrease and (ii) intervals of optical axes of the output beams gradually decrease. (f) of FIG. 9 is a view illustrating the output beam bundle on an f-f' cross-sectional surface (a cross-sectional surface near an incident edge surface of an optical fiber OF) taken along a line f-f' in FIG. 8. As illustrated in (f) of FIG. 9, beam spots L1 to L10 of the output beams emitted from the S-axis light collecting lens SL overlap with one another on the f-f' cross-sectional surface. That is, a point (a point at which a beam diameter in the F-axis direction becomes minimum) at which each of the output beams is collected coincides with an intersection of the beams (an intersection at which the output beams intersect with one another).

As described above, collecting the output beams in the F-axis direction by use of the collecting F-axis collimating lens FACi allows the point at which each of the output beams is collected and the intersection of the beams to coincide with each other. Accordingly, an output beam emitted from each LD chip LDi can be coupled further efficiently to the optical fiber OF. This makes it possible to improve a coupling efficiency of the output beam bundle to the optical fiber OF in the LD module 1 according to the present embodiment.

Note that in the present modified example, as illustrated in FIG. 8, an offset of each F-axis collimating lens FACi is individually set, so that the point at which each of the output beams is collected coincides with the intersection of the output beam bundle. Specifically, an offset $\Delta i$ of each F-axis collimating lens FACi is set so as to satisfy the relation $\Delta 1 > \Delta 2 > \ldots > \Delta 10$, so that the point at which each of the output beams is collected coincides with the intersection of the output beam bundle.

Note, however, that a configuration for causing the points at which all of the output beams are respectively collected to coincide with the intersection of the beams is not limited to this. For example, it is possible to employ a configuration in which (i) the offset of each F-axis collimating lens FACi is uniformly set and (ii) then, a distance from an emission-side edge surface of each S-axis collimating lens SACi to the intersection of the beams (the incident edge surface of the optical fiber OF) is individually set so that the point at which the laser beam having transmitted the each F-axis collimating lens FACi is collected coincides with the intersection of the output beam bundle.

Further, it is possible to employ, for example, a configuration in which (i) the offset of each F-axis collimating lens FACi is uniformly set and (ii) then, a refractive index and/or a radius of curvature of the each F-axis collimating lens FACi are/is individually set so that the point at which each of the laser beams having transmitted the each F-axis collimating lens FACi is collected coincides with the intersection of the output beam bundle.

Note that the present modified example employs a configuration in which the F-axis collimating lens FACi is used in order to collect the output beams, but the present modified example is not limited to this. It is only necessary in the present modified example that the point at which each of the output beams is collected and the intersection of the output beams coincide with each other. For example, it is possible to employ a configuration in which either one of the first mirror Mi1 and the second mirror Mi2 is changed to a concave mirror, and the output beams are collected by use of the concave mirror. In this case, a curvature of each concave mirror should be individually set, or each concave mirror should be provided so as to make a light path length from the each concave mirror to the intersection of the beams (the incident edge surface of the optical fiber OF) constant.

Second Embodiment

The following discusses an LD module 1' according to Second Embodiment of the present invention, with reference to a drawing. Note that the same reference sign will be given to a member common between the First Embodiment and the Second Embodiment, and detailed descriptions on such a member will be omitted.

[Configuration of LD Module 1']

The following discusses a configuration of the LD module 1' according to the present embodiment, with reference to FIG. 10. FIG. 10 is a plan view illustrating the configuration of the LD module 1'.

The LD module 1' according to the present embodiment is a module for coupling laser beams emitted from N LD chips LD1 to LD10 to an optical fiber OF. Note that the LD module 1' according to the present embodiment is also not limited to a case where N=10 (N can be any integer of two or more).

In the present embodiment, a configuration in which (i) positions at which respective LD chips LDi are mounted differ in a y-axis direction and (ii) an output beam emitted from each LD chip LDi is reflected by a corresponding one of mirrors M1' to M10' is employed.

As illustrated in (a) of FIG. 10, the LD module 1' includes ten F-axis collimating lenses FAC1 to FAC10, ten S-axis collimating lenses SAC1 to SAC10, ten mirrors M1' to M10', a base plate B, an F-axis converging lens FL, and an S-axis light collecting lens SL, as well as the ten LD chips LD1 to LD10. In the LD module 1', a unit optical system is made up of an optical system constituted by an LD chip LDi, an F-axis collimating lens FACi, an S-axis collimating lens SACi, and a mirror Mi'.

Further, as illustrated in (a) of FIG. 10, the LD chips LD1 to LD10, the F-axis collimating lenses FAC1 to FAC10, the S-axis collimating lens SAC1 to SAC10 are mounted on a respective plurality of flat surfaces of a stepped mount S. The plurality of flat surfaces are parallel to a zx plane and have respective different heights (positions in the y-axis direction). Note that what is important here is a positional relationship between optical elements constituting the LD module 1', and whether or not to mount each of the optical elements on the stepped mount S can be changed as appropriate.

(b) of FIG. 10 is a cross-sectional view illustrating an a-a' cross-sectional surface, taken along a line a-a' in (a) of FIG. 10, of the LD module 1', which view is obtained when the a-a' cross-sectional surface is viewed against a z-axis negative direction. As illustrated in (b) of FIG. 10, in the stepped mount S, an (i+1)th flat surface (as counted in a direction from an x-axis negative side to an x-axis positive side) is a flat surface which is (i) closer to the x-axis positive side than an adjacent i-th flat surface is and (ii) closer to a y-axis positive side than the i-th flat surface is. Accordingly, steps of the flat surfaces of the stepped mount S are arranged such that the closer a step is located to the x-axis positive side, the closer the step is located to the y-axis positive side (is located in a higher position).

Note that the present embodiment discusses a configuration in which the stepped mount S having N flat surfaces of respective different steps is used in order to mount N unit optical systems, but the present invention is not limited to this. For example, it is possible to employ a configuration in which a unit optical system Si is mounted on the base plate B, and unit optical systems S2 to S10 are mounted on (N−1) flat surfaces of respective different steps of a stepped mount S' having the (N−1) flat surfaces. It is also possible to employ a configuration in which the base plate B has N flat surfaces of respective different steps, and a unit optical system Si is mounted on a corresponding one of the N flat surfaces.

All of the stepped mount S, the mirrors M1' to M10', the F-axis converging lens FL, and the S-axis light collecting lens SL are mounted on the base plate B directly or via a mount (not illustrated).

The mirror Mi' causes a propagation direction of an output beam emitted from the LD chip LDi and having entered the mirror Mi' from the z-axis negative direction to be changed to a substantially x-axis negative direction. As such, the mirror Mi' is a mirror whose length in the y-axis direction is longer than a distance from the base plate B to a plane parallel to the output beam emitted from the chip LDi.

Accordingly, the mirror Mi' is provided so that an optical axis of the output beam entering the mirror Mi' and a reflective surface of the mirror Mi' make an angle of 45° in a plane parallel to the zx plane and to the output beam emitted from the LD chip LDi. Further, a distance from the LD chip LDi to the mirror Mi' in a z-axis direction is constant. Accordingly, optical axes of output beams emitted from respective LD chips LDi in a z-axis positive direction are aligned along a y axis in a plane parallel to the xy plane.

As illustrated in (c) of FIG. 10, in the present embodiment, the mirror Mi' is provided so as to be slightly inclined with respect to the y axis. The mirror Mi' is fixed to the base plate B by use of means F for fixation (e.g., adhesive etc.) so that an angle of inclination of the mirror Mi' is maintained. Further, angles of inclination of the mirrors M1' to M10' with respect to the y axis are set so that optical axes of corresponding output beams intersect with one another at a single point without relying on the F-axis converging lens FL.

In a similar manner to the First Embodiment, an output beam reflected by the mirror Mi' transmits the F-axis converging lens FL and the S-axis light collecting lens SL, and then is coupled to the optical fiber OF on an incident edge surface of the optical fiber OF.

Note that in the present embodiment, a case in which the mirrors M1' to M10' having respective different lengths in the y-axis direction has been discussed, but the present embodiment is not limited to this. For example, the mirrors M1' to M10' can be identical in size in a case where the mirrors M1' to M10' are mounted on respective submounts that differ in length in the y-axis direction.

In the present embodiment, the employment of the configuration as described above makes it possible to reduce the number of mirrors provided on a light path of an output beam emitted from the LD chip LDi to only one (1). This makes it possible to reduce a light path length of a light path along which the output beam emitted from the LD chip LDi propagates until the output beam enters the incident edge surface of the optical fiber OF. Further, since the number of members can be reduced by one, cost reduction and simplified optical adjustment can be achieved.

Note that it is possible to employ, as a modified example of the present embodiment, a configuration in which an output beam emitted from the LD chip LDi is collected so as to be coupled to the optical fiber OF, like the modified example of the LD module 1 according to the First Embodiment.

In this case, points at which output beams are respectively collected can coincide with an intersection of the output beams. This allows the LD module 1' according to the present embodiment to have an improved coupling efficiency of an output beam bundle to the optical fiber OF.

Third Embodiment

The following discusses an LD module 1" according to Third Embodiment of the present invention, with reference to a drawing. Note that the same reference sign will be given to a member common between the First Embodiment and the Third Embodiment, and detailed descriptions on such a member will be omitted.

[Configuration of LD Module 1"]

The following discusses a configuration of the LD module 1" according to the present embodiment, with reference to FIG. 11. FIG. 11 is a plan view illustrating the configuration of the LD module 1".

The LD module 1" according to the present embodiment is a module for coupling laser beams emitted from N LD chips LD1 to LD10 to an optical fiber OF. Note that the LD module 1" according to the present embodiment is also not limited to a case where N=10 (N can be any integer of two or more).

The present embodiment employs a configuration in which no mirror is used and respective LD chips LDi are provided on top of one another in a y-axis direction so that the LD chips LDi have respective different angles of inclination with respect to a z axis.

As such, as illustrated in FIG. 11, the LD module 1" includes N F-axis collimating lenses FAC1 to FAC10, N S-axis collimating lenses SAC1 to SAC10, N auxiliary base plates B1 to M10, a base plate B, an F-axis converging lens FL, and an S-axis light collecting lens SL, as well as the N LD chips LD1 to LD10.

As illustrated in FIG. 11, the LD chips LD1 to L10, the F-axis collimating lenses FAC1 to FAC10, and the S-axis collimating lenses SAC1 to SAC10 are mounted on the respective auxiliary base plates B1 to B10. That is, each unit optical system Si is mounted on a corresponding auxiliary base plate Bi. At this time, positions in an x-axis direction of unit optical systems Si mounted on respective auxiliary base plates Bi are adjusted to be uniform so that optical axes of output beams which propagate from respective LD chips LDi in a z-axis positive direction are aligned along a y axis in a plane parallel to an xy plane.

All of the auxiliary base plates B1 to B10, the F-axis converging lens FL, and the S-axis light collecting lens SL are mounted on the base plate B directly or via a mount (not illustrated).

Note that the present embodiment employs, in order to facilitate adjustment of an angle of inclination of each LD chip LDi, a configuration in which a unit optical system S'i (identical to the unit optical system Si illustrated in FIG. 2 except that the double mirror Mi is omitted) is mounted on a corresponding auxiliary base plate Bi that is mounted on the base plate B, but the present invention is not limited to this. For example, it is possible to employ a configuration in which the unit optical system S'i is mounted on the base plate B with no auxiliary base plate Bi interposed between the unit optical system S'i and the base plate B.

Since no mirror is used in the present embodiment, an output beam emitted from the LD chip LDi transmits the F-axis collimating lens FACi and the S-axis collimating lens SACi, and then enters the F-axis converging lens FL. Note here that an angle of inclination of the auxiliary base plate Bi with respect to the z axis is set so that optical axes of the output beams intersect with one another at a single point without relying on the F-axis converging lens FL.

In a similar manner to the First Embodiment, an output beam having entered the F-axis converging lens FL transmits the S-axis light collecting lens SL, and then is coupled to the optical fiber OF on an incident edge surface of the optical fiber OF.

In the present embodiment, the employment of the configuration as described above eliminates the need to provide a mirror on a light path of an output beam emitted from the LD chip LDi. This brings about an advantageous effect that a light path length of a light path along which an output beam emitted from the LD chip LDi propagates until the output beam enters the incident edge surface of the optical fiber OF. This allows a housing of the LD module 1" according to the present embodiment to be reduced in size.

Note that it is possible to employ, as a modified example of the present embodiment, a configuration in which an output beam emitted from the LD chip LDi is collected so as to be coupled to the optical fiber OF, like the modified example of the LD module 1 according to the First Embodiment.

In this case, points at which output beams are respectively collected can coincide with an intersection of the output beams. This allows the LD module 1" according to the present embodiment to have an improved coupling efficiency of an output beam bundle to the optical fiber OF.

[Conclusion]

As described above, a multiplexer according to the present embodiment includes: an output section outputting a beam bundle made of a plurality of laser beams whose optical axes are contained in a single plane, each of the plurality of laser beams having an F-axis that is not orthogonal to the single plane; and a converging lens converging the beam bundle outputted from the output section, extensions of the optical axes of the plurality of laser beams at a portion where the beam bundle has been outputted from the output section but has not been converged by the converging lens intersecting with each other at a single point, an intersection of the plurality of laser beams at a portion where the beam bundle has been converged by the converging lens being formed at a position that is closer to the converging lens than a focal point of the converging lens is.

The configuration above brings about the following advantageous effects when the beam bundle having been converged by the converging lens is caused to enter the optical fiber having an incident edge surface located at the intersection at which the laser beams constituting the beam bundle intersect with each other.

That is, an incidence angle at which each of the plurality of laser beams constituting the beam bundle having been converged by the converging lens enters the optical fiber can be reduced as compared with a case in which optical axes of the plurality of laser beams constituting the beam bundle that has not been converged by the converging lens are parallel to each other. This makes it possible to increase a coupling efficiency to the optical fiber as compared with the case in which the optical axes of the plurality of laser beams constituting the beam bundle that has not been converged by the converging lens are parallel to each other.

In other words, a radius of curvature of the converging lens can be reduced without increasing the incidence angle at which each of the plurality of laser beams constituting the beam bundle having been converged by the converging lens enters the optical fiber, that is, without decreasing the coupling efficiency to the optical fiber. This allows a position of the incident edge surface of the optical fiber to be closer to the converging lens, as compared with the case in which the optical axes of the plurality of laser beams constituting the beam bundle that has not been converged by the converging lens are parallel to each other. Accordingly, mounting the multiplexer in an LD module (by applying the configuration above to a multiplexer mounted in an LD module) makes it possible to reduce a size of the LD module.

Further, according to the configuration above, each of the plurality of laser beams constituting the beam bundle having been converged by the converging lens can be caused to enter the converging lens at a position closer to a center of the converging lens, as compared with the case in which the optical axes of the plurality of laser beams constituting the beam bundle that has not been converged by the converging lens are parallel to each other. Accordingly, mounting the multiplexer in an LD module makes it possible to prevent a coupling efficiency to the optical fiber from being decreased due to an influence of aberration of the F-axis converging lens.

The multiplexer according to the present embodiment is preferably configured such that the intersection of the plurality of laser beams at the portion where the beam bundle has been outputted from the output section and then converged by the converging lens is formed outside the converging lens.

According to the configuration above, for example, the incident edge surface of the optical fiber can be positioned at the intersection. Accordingly, mounting the multiplexer in an LD module makes it possible to reduce a size of the LD module and improve a quality of the LD module.

The multiplexer according to the present embodiment is preferably configured such that the multiplexer further includes an F-axis collimating lens which is provided on a light path of each of the plurality of laser beams constituting the beam bundle and is offset, in a propagation direction of the each of the plurality of laser beams, relative to a position at which a divergence of the each of the plurality of output beams in an F-axis direction is collimated, an offset of the F-axis collimating lens provided on the light path of the each of the plurality of laser beams being individually set so that a beam diameter of the each of the plurality of laser beams in the F-axis direction becomes minimum at the intersection.

Further, the multiplexer according to the present embodiment is preferably configured such that the multiplexer further includes an F-axis collimating lens which is provided on a light path of each of the plurality of laser beams constituting the beam bundle and is offset, in a propagation direction of the each of the plurality of laser beams, relative to a position at which a divergence of the each of the plurality of output beams in an F-axis direction is collimated, an offset of the F-axis collimating lens provided on the light path of the each of the plurality of laser beams being uniformly set, a light path length from a beam emission-side edge surface of an S-axis collimating lens provided on the light path of the each of the plurality of laser beams to the intersection being individually set so that a beam diameter, in the F-axis direction, of the each of the plurality of the laser beams becomes minimum at the intersection.

According to the configuration above, a beam diameter of the plurality of laser beams constituting the beam bundle is minimized at the intersection of the plurality of laser beams. This makes it possible to increase further the coupling efficiency with which the beam bundle enters the optical fiber.

The multiplexer according to the present embodiment is preferably configured such that the output section is constituted by: a group of laser light sources generating a beam bundle made of a plurality of laser beams whose optical axes are contained in a single plane, each of the plurality of laser beams having an F-axis that is not orthogonal to the single plane; and a group of mirrors reflecting the plurality of laser beams constituting the beam bundle generated by the group of laser light sources, the group of mirrors being made of mirrors each having a reflective surface whose orientation is adjusted so that optical axes of the plurality of laser beams reflected by the respective mirrors intersect with each other at a single point.

The configuration above makes it possible to provide a multiplexer having a simplified configuration.

The multiplexer according to the present embodiment is preferably configured such that the reflective surface of each of the mirrors constituting the group of mirrors has a concave shape so that a beam diameter of a laser beam reflected by the each of the mirrors becomes minimum at the intersection.

According to the configuration above, a beam diameter of the plurality of laser beams constituting the beam bundle is minimized at the intersection of the plurality of laser beams. This makes it possible to increase further the coupling efficiency with which the beam bundle enters the optical fiber.

The multiplexer according to the present embodiment is preferably configured such that each of the mirrors constituting the group of mirrors is a double mirror constituted by a first mirror mounted on a specific flat surface and a second mirror mounted on the first mirror; the first mirror has a first reflective surface whose normal makes an angle of 45° with a normal of the specific flat surface, the first reflective surface reflecting a corresponding one of the plurality of laser beams generated by the group of laser light sources; the second mirror has a second reflective surface whose normal makes an angle of 135° with the normal of the specific flat surface, the second reflective surface reflecting the corresponding one laser beam that has been reflected by the first reflective surface; and an orientation of the second reflective surface is adjusted so that optical axes of the plurality of laser beams that have been reflected by the respective second mirrors intersect with each other at a single point.

The configuration above makes it possible to provide a compact multiplexer that allows easy adjustment for causing the plurality of laser beams constituting the beam bundle to intersect with each other at a single point.

The multiplexer according to the present embodiment is preferably configured such that the output section is constituted by a group of laser light sources generating a beam bundle made of a plurality of laser beams whose optical axes are contained in a single plane, each of the plurality of laser beams having an F-axis that is not orthogonal to the single plane; and an orientation of each of laser light sources constituting the group of laser light sources is set so that the optical axes of the plurality of laser beams intersect with each other at a single point.

The configuration above makes it possible to provide a multiplexer having a further simplified configuration.

As described above, a multiplexing method according to the present embodiment includes the steps of: (a) outputting a beam bundle made of a plurality of laser beams whose optical axes are contained in a single plane, each of the plurality of laser beams having an F-axis that is not orthogonal to the single plane; and (b) converging, by use of a converging lens, the beam bundle outputted in the step (a), extensions of the optical axes of the plurality of laser beams at a portion where the beam bundle has been outputted in the step (a) but has not been converged in the step (b) intersecting with each other at a single point, an intersection of the plurality of laser beams at a portion where the beam bundle has been converged in the step (b) being formed at a position that is closer to the converging lens than a focal point of the converging lens is.

The configuration above brings about advantageous effects similar to those of the multiplexer.

Note that the scope of the present invention also encompasses an LD module including the multiplexer and an optical fiber having an incident edge surface that is located at the intersection of the plurality of laser beams constituting the beam bundle that has been converged by the converging lens.

[Additional Matters]

The present invention is not limited to the description of the embodiments above, but may be altered as appropriate by a skilled person within the scope of the claims. That is, the present invention encompasses an embodiment based on a proper combination of technical means modified as appropriate within the scope of the claims.

INDUSTRIAL APPLICABILITY

The present invention can be suitably applied to an LD module, and in particular, to an LD module that has an LD chip(s) as a light source.

REFERENCE SIGNS LIST

LD module
LD1 to LD10 LD chip
FAC1 to FAC10 F-axis collimating lens

SAC1 to SAC10 S-axis collimating lens
M1 to M10 double mirror
Mi1 first mirror
S1 reflective surface (first reflective surface)
Mi2 second mirror
S2 reflective surface (second reflective surface)
B base plate
FL F-axis light converging lens
SL S-axis light collecting lens

The invention claimed is:

1. A multiplexer comprising:
an output section outputting a beam bundle made of a plurality of laser beams whose optical axes are contained in a single plane, each of the plurality of laser beams having an F-axis that is not orthogonal to the single plane; and
a converging lens converging the beam bundle outputted from the output section,
extensions of the optical axes of the plurality of laser beams at a portion where the beam bundle has been outputted from the output section but has not been converged by the converging lens intersecting with each other at a single point,
an intersection of the plurality of laser beams at a portion where the beam bundle has been converged by the converging lens being formed at a position that is closer to the converging lens than a focal point of the converging lens is,
the output section being constituted by: a group of laser light sources generating a beam bundle made of a plurality of laser beams whose optical axes are contained in a single plane; and a group of mirrors being made of double mirrors reflecting the plurality of laser beams constituting the beam bundle generated by the group of laser light sources,
each of the double mirrors, constituting the group of mirrors, being constituted by a first mirror mounted on a specific flat surface and a second mirror mounted on the first mirror and provided separately from the first mirror,
the first mirror having a first reflective surface which reflects, to an outside of the first mirror, a corresponding one of the plurality of laser beams generated by the group of laser light sources and being incident from the outside of the first mirror onto the first reflective surface,
the second mirror having a second reflective surface which reflects, to an outside of the second mirror, the corresponding one laser beam that has been reflected by the first reflective surface and is incident from the outside of the second mirror onto the second reflective surface,
a plurality of laser light sources, constituting the group of laser light sources, being located so that respective emission edge surfaces of the plurality of laser light sources face in a specific direction,
the first mirror being adjusted to be oriented so that a projection, on the specific flat surface, of a normal vector of the first reflective surface faces opposite to the specific direction,
the second mirror being adjusted to be oriented so that optical axes of the plurality of laser beams that have been reflected by the second reflective surface intersect with each other at a single point.

2. The multiplexer as set forth in claim 1, wherein the intersection is formed outside the converging lens.

3. A multiplexer as set forth in claim 1, further comprising an F-axis collimating lens which is provided on a light path of each of the plurality of laser beams constituting the beam bundle and is offset, in a propagation direction of the each of the plurality of laser beams, relative to a position at which a divergence of the each of the plurality of output beams in an F-axis direction is collimated,
an offset of the F-axis collimating lens provided on the light path of the each of the plurality of laser beams being individually set so that a beam diameter of the each of the plurality of laser beams in the F-axis direction becomes minimum at the intersection.

4. A multiplexer as set forth in claim 1, further comprising:
an F-axis collimating lens which is provided on a light path of each of the plurality of laser beams constituting the beam bundle and is offset, in a propagation direction of the each of the plurality of laser beams, relative to a position at which a divergence of the each of the plurality of output beams in an F-axis direction is collimated; and
an S-axis collimating lens which is provided on the light path of the each of the plurality of laser beams constituting the beam bundle,
an offset of the F-axis collimating lens provided on the light path of the each of the plurality of laser beams being uniformly set,
a light path length from a beam emission-side edge surface of an S-axis collimating lens provided on the light path of the each of the plurality of laser beams to the intersection being individually set so that a beam diameter, in the F-axis direction, of the each of the plurality of the laser beams becomes minimum at the intersection.

5. The multiplexer as set forth in claim 1, wherein the reflective surface of each of the mirrors constituting the group of mirrors has a concave shape so that a beam diameter of a laser beam reflected by the each of the mirrors becomes minimum at the intersection.

6. The multiplexer as set forth in claim 1, wherein:
a normal of the first reflective surface makes an angle of 45° with a normal of the specific flat surface; and
a normal of the second reflective surface makes an angle of 135° with the normal of the specific flat surface.

7. An LD module comprising:
a multiplexer recited in claim 1; and
an optical fiber having an incident edge surface that is located at the intersection of the plurality of laser beams constituting the beam bundle that has been outputted from the output section and then converged by the converging lens.

8. The multiplexer as set forth in claim 1, wherein the first mirror reflects the corresponding one laser beam without allowing the corresponding one laser beam to enter inside of the first mirror, and the second mirror reflects the corresponding one laser beam without allowing the corresponding one laser beam to enter inside of the second mirror.

9. A multiplexer comprising:
an output section outputting a beam bundle made of a plurality of laser beams whose optical axes are contained in a single plane, each of the plurality of laser beams having an F-axis that is not orthogonal to the single plane; and
a converging lens converging the beam bundle outputted from the output section,
extensions of the optical axes of the plurality of laser beams at a portion where the beam bundle has been outputted from the output section but has not been converged by the converging lens intersecting with each other at a single point, an intersection of the plurality of laser beams at a portion where the beam bundle has been converged by the converging lens being formed at a position that is closer to the converging lens than a focal point of the converging lens is, the output section being constituted by: a group of laser light sources generating a beam bundle made of a plurality of laser beams whose optical axes are contained in a single plane; and a group of mirrors being made of double mirrors reflecting the plurality of laser beams constituting the beam bundle generated by the group of laser light sources, each of the double mirrors, constituting the group of mirrors, being constituted by a first mirror mounted on a specific flat surface and a second mirror provided separately from the first mirror and bonded to the first mirror while being mounted on the first mirror, the first mirror having a first reflective surface which reflects, to an outside of the first mirror, a corresponding one of the plurality of laser beams generated by the group of laser light sources and being incident from the outside of the first mirror onto the first reflective surface, the second mirror having a second reflective surface which reflects the corresponding one laser beam that has been reflected by the first reflective surface and enters the second mirror without passing through an interface between the first mirror and the second mirror, which are bonded together, a plurality of laser light sources, constituting the group of laser light sources, being located so that respective emission edge surfaces of the plurality of laser light sources face in a specific direction, the first mirror being adjusted to be oriented so that a projection, on the specific flat surface, of a normal vector of the first reflective surface faces opposite to the specific direction, the second mirror being adjusted to be oriented so that optical axes of the plurality of laser beams that have been reflected by the second reflective surface intersect with each other at a single point.

* * * * *